United States Patent
Yi et al.

(10) Patent No.: US 12,126,122 B2
(45) Date of Patent: Oct. 22, 2024

(54) ELECTRONIC DEVICE INCLUDING INTERFACE TERMINAL HAVING OUTER SHELL AND BRACKET

(71) Applicant: Samsung Electronics Co., Ltd., Gyeonggi-do (KR)

(72) Inventors: Juho Yi, Gyeonggi-do (KR); Sunggeun Kang, Gyeonggi-do (KR); Waneui Jung, Gyeonggi-do (KR); Heejin Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 317 days.

(21) Appl. No.: 17/569,889

(22) Filed: Jan. 6, 2022

(65) Prior Publication Data
US 2022/0200212 A1 Jun. 23, 2022

Related U.S. Application Data

(63) Continuation of application No. PCT/KR2021/019650, filed on Dec. 22, 2021.

(30) Foreign Application Priority Data

Dec. 23, 2020 (KR) .................. 10-2020-0182597

(51) Int. Cl.
*H01R 13/6594* (2011.01)
*G06F 1/16* (2006.01)
(Continued)

(52) U.S. Cl.
CPC ....... *H01R 13/6594* (2013.01); *G06F 1/1658* (2013.01); *G06F 1/185* (2013.01);
(Continued)

(58) Field of Classification Search
CPC .................. H01R 13/6594; H01R 12/722; H01R 12/727; H01R 13/5202; H01R 13/6581;
(Continued)

(56) References Cited

U.S. PATENT DOCUMENTS 9,882,322 B2 1/2018 Chung
9,991,623 B2 6/2018 Kim et al.
(Continued)

FOREIGN PATENT DOCUMENTS

CN 205790744 12/2016
CN 108321634 A * 7/2018 ........... H01R 12/727
(Continued)

OTHER PUBLICATIONS

International Search Report dated Mar. 31, 2022 issued in counterpart application No. PCT/KR2021/019650, 9 pages.

*Primary Examiner* — Justin M Kratt
(74) *Attorney, Agent, or Firm* — The Farrell Law Firm, P.C.

(57) ABSTRACT

An electronic device is provided, which includes a printed circuit board (PCB) including a first surface and a second surface facing in a direction opposite to the first surface; and an interface terminal positioned at least partially on the first surface of the PCB, The interface terminal includes a shell including a hollow portion extending from a first opening on a first side of the shell to a second opening on a second side of the shell, a terminal structure including a non-conductive plate positioned in the hollow portion and a plurality of terminals positioned on the non-conductive plate, a first bracket that at least partially covers a surface of the shell, and a second bracket that at least partially covers another surface of the shell. The second bracket includes a protrusion protruding with respect to the second surface of the PCB.

19 Claims, 13 Drawing Sheets

(51) Int. Cl.
*G06F 1/18* (2006.01)
*H04M 1/02* (2006.01)
*H01R 12/72* (2011.01)
*H01R 13/52* (2006.01)
*H01R 13/6581* (2011.01)
*H01R 13/6591* (2011.01)
*H01R 24/60* (2011.01)
*H01R 107/00* (2006.01)
*H05K 1/18* (2006.01)
*H05K 3/30* (2006.01)

(52) U.S. Cl.
CPC ....... *H04M 1/0274* (2013.01); *H04M 1/0277* (2013.01); *G06F 1/1684* (2013.01); *H01R 12/722* (2013.01); *H01R 12/727* (2013.01); *H01R 13/5202* (2013.01); *H01R 13/6581* (2013.01); *H01R 13/6591* (2013.01); *H01R 24/60* (2013.01); *H01R 2107/00* (2013.01); *H01R 2201/16* (2013.01); *H05K 1/18* (2013.01); *H05K 1/181* (2013.01); *H05K 1/182* (2013.01); *H05K 1/184* (2013.01); *H05K 1/189* (2013.01); *H05K 3/301* (2013.01); *H05K 2201/09027* (2013.01); *H05K 2201/09063* (2013.01); *H05K 2201/10189* (2013.01); *H05K 2201/10393* (2013.01); *H05K 2201/10409* (2013.01)

(58) Field of Classification Search
CPC ........................... H01R 13/6591; H01R 24/60; H01R 2107/00; H01R 2201/16; G06F 1/1658; G06F 1/185; G06F 1/1684; H04M 1/0274; H04M 1/0277; H05K 1/18; H05K 1/181; H05K 1/182; H05K 1/184; H05K 1/189; H05K 3/301; H05K 2201/09027; H05K 2201/09063; H05K 2201/10189; H05K 2201/10393; H05K 2201/10409
See application file for complete search history.

(56) References Cited

U.S. PATENT DOCUMENTS

| | | | |
|---|---|---|---|
| 10,299,399 B2 | 5/2019 | Yilmaz et al. | |
| 11,246,229 B2 | 2/2022 | Lee et al. | |
| 2003/0054694 A1* | 3/2003 | Takamori | H01R 12/7094 439/630 |
| 2014/0220827 A1 | 8/2014 | Hsu et al. | |
| 2016/0104957 A1* | 4/2016 | Kim | H01R 13/5219 439/78 |
| 2017/0302037 A1* | 10/2017 | Yao | H01R 24/60 |
| 2018/0252988 A1* | 9/2018 | Ejiri | G06F 1/1626 |

FOREIGN PATENT DOCUMENTS

| | | |
|---|---|---|
| CN | 210806089 | 6/2020 |
| KR | 10-2016-0126171 | 11/2016 |
| KR | 10-1686916 | 12/2016 |
| KR | 10-1753287 | 6/2017 |
| KR | 1020170138789 | 12/2017 |
| KR | 10-1927931 | 12/2018 |
| KR | 10-1959264 | 3/2019 |
| KR | 10-1982542 | 5/2019 |
| KR | 1020190091694 | 8/2019 |
| KR | 1020190137503 | 12/2019 |
| KR | 1020200101178 | 8/2020 |
| KR | 10-2371856 | 3/2022 |
| KR | 1020220083137 | 6/2022 |

* cited by examiner

ELECTRONIC DEVICE INCLUDING INTERFACE TERMINAL HAVING OUTER SHELL AND BRACKET

CROSS-REFERENCE TO RELATED APPLICATION(S)

This application is a bypass continuation application of International Application No. PCT/KR2021/019650, which was filed on Dec. 22, 2021, and is based on and claims priority under 35 U.S.C. § 119 to Korean Patent Application No. 10-2020-0182597, which was filed in the Korean Intellectual Property Office on Dec. 23, 2020, the entire disclosure of each of which is incorporated herein by reference.

BACKGROUND

1. Field

The disclosure relates generally to an electronic device including an interface terminal.

2. Description of Related Art

An electronic device such as a smartphone may include a connector (e.g., interface terminal such as a universal serial bus (USB) connector) for connection with an external electronic device. The electronic device may transmit and/or receive power and/or data to and/or from the external electronic device connected via the connector.

However, as electronic devices gradually become slimmer, it is becoming more difficult to secure space for or efficiently arrange components, such as USB connectors, in the electronic devices. For example, when placing a printed circuit board (PCB) on which a connector is disposed in the electronic device, it may be difficult to use an assembly device such as a jig for structural reasons.

SUMMARY

The disclosure has been made to address the above-mentioned problems and disadvantages, and to provide at least the advantages described below.

An aspect of the disclosure is to provide an electronic device including an interface terminal capable of securing efficient assembly and mass production when placing a PCB on which an interface terminal (e.g., a connector) is disposed in the electronic device.

In accordance with an aspect of the disclosure, an electronic device is provided, which includes a PCB including a first surface and a second surface facing in a direction opposite to the first surface; and an interface terminal positioned at least partially on the first surface of the PCB. The interface terminal includes a shell including a hollow portion extending from a first opening on a first side of the shell to a second opening on a second side of the shell, a terminal structure including a non-conductive plate positioned in the hollow and a plurality of terminals positioned on the non-conductive plate, a first bracket that at least partially covers a surface of the shell, and a second bracket that at least partially covers another surface of the shell. The second bracket includes a protrusion protruding with respect to the second surface of the PCB.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Hereinafter, various embodiments of the disclosure will be described with reference to the accompanying drawings.

The various embodiments of the disclosure and the terminology used are not intended to limit the technical features described herein to specific embodiments, but are to include various modifications, equivalents, and/or alternatives thereof.

In connection with the description of the drawings, similar reference symbols may be used for similar or related components.

The singular form of a noun corresponding to an item may include one or multiple instances of the item unless clearly indicated otherwise in a related context.

The expression "A or B", "at least one of A and B", "at least one of A or B", "A, B or C", "at least one of A, B and C", or "at least one of A, B or C" may include any one of the listed items or all possible combinations thereof. The terms "$1^{st}$" and "$2^{nd}$" or "first" and "second" may be used to simply distinguish one element from another element, without limiting corresponding elements in another aspect (e.g., importance or order).

An electronic device according to an embodiment can include various types of devices. For example, an electronic device may include a portable communication device (e.g., smartphone), a computer, a portable multimedia device, a portable medical instrument, a camera, a wearable device, and a home appliance, but is not limited to the above-described devices.

Figure 1:
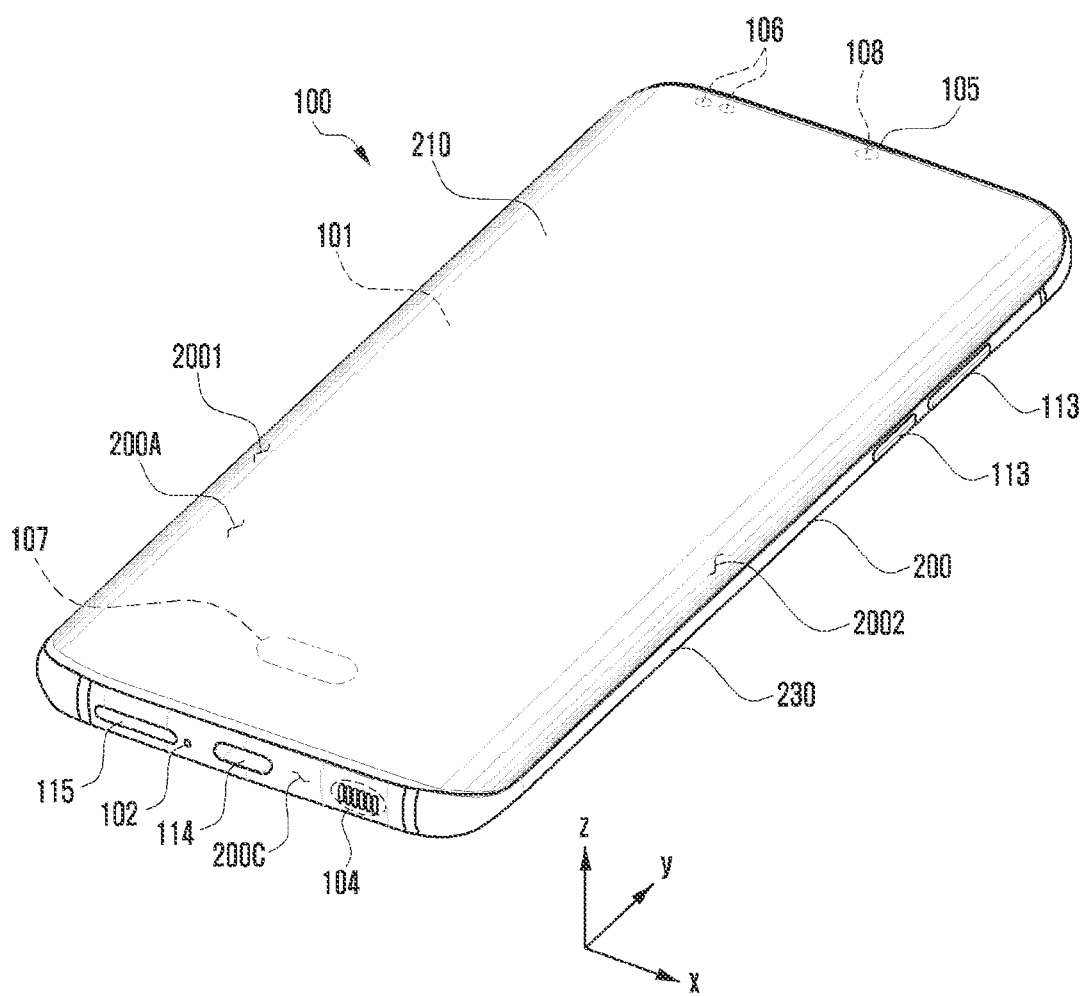
FIG. 1 illustrates a front view of a mobile electronic device according to an embodiment.
Figure 2:
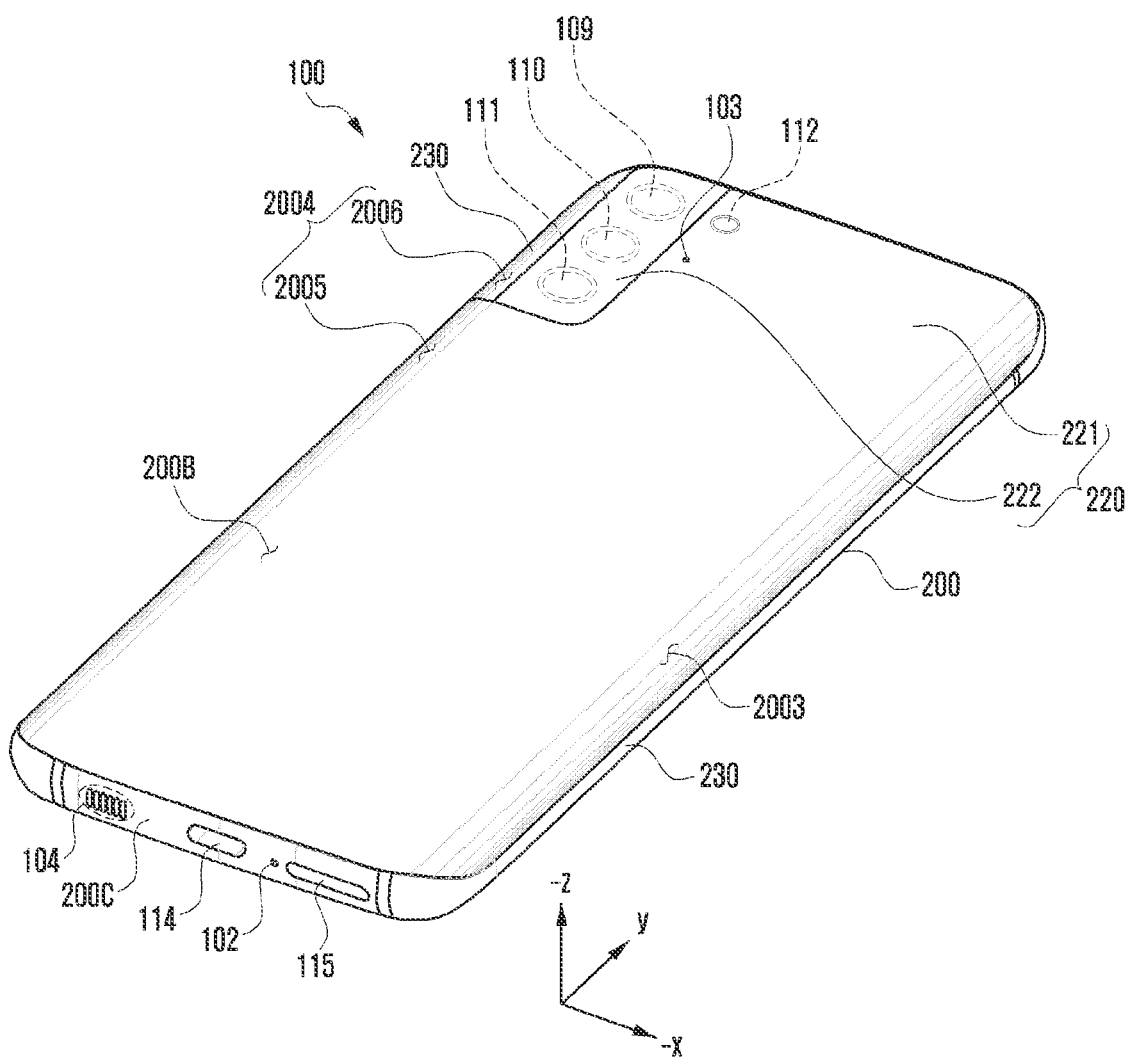
FIG. 2 illustrates a rear view of the electronic device of FIG. 1, according to an embodiment.

FIG. 1 illustrates a front view of a mobile electronic device according to an embodiment. FIG. 2 illustrates a rear view of the electronic device of FIG. 1, according to an embodiment.

Referring to FIGS. 1 and 2, an electronic device 100 may include a housing 200 that includes a first surface (or, front surface) 200A facing in a first direction (e.g., positive z-axis direction), a second surface (or, rear surface) 200B facing in a second direction (e.g., negative z-axis direction) opposite to the first direction, and a side surface 200C surrounding the space between the first surface 200A and the second surface 200B. In some embodiments, the housing 200 may also refer to a structure forming at least a portion of the first surface 200A, the second surface 200B, and the side surface 200C.

The housing 200 may include a first region 2001 and a second region 2002 that are curved and extended seamlessly from the first surface 200A toward the second surface 200B. The first region 2001 and the second region 2002 may be symmetrical to each other with, e.g., the first surface 200A (e.g., a flat portion) interposed therebetween. The housing 200 may include a third region 2003 and a fourth region 2004 that are curved and extended seamlessly from the second surface 200B toward the first surface 200A. The third region 2003 may be located on the opposite side to the first region 2001 in correspondence to the first region 2001, and the fourth region 2004 may be located on the opposite side to the second region 2002 in correspondence to the second region 2002. The third region 2003 and the fourth region 2004 may be symmetrical to each other with, e.g., the second surface 200B (e.g., a flat portion) interposed therebetween. The first region 2001, the second region 2002, the third region 2003, and the fourth region 2004 may belong to the side surface 200C of the housing 200. In some embodiments, the first region 2001 and the second region 2002 may belong to the first surface 200A, and the third region 2003 and the fourth region 2004 may belong to the second surface 200B.

In some embodiment, the housing 200 may also be implemented without at least one of the first region 2001, the second region 2002, the third region 2003, or the fourth region 2004. For example, the first surface 200A may be expanded by replacing at least one of the first region 2001 or the second region 2002, and/or the second surface 200B may be expanded by replacing at least one of the third region 2003 or the fourth region 2004.

The housing 200 may include a first housing part 210, a second housing part 220, and a third housing part 230. The first housing part 210 may be located on the opposite side to the second housing part 220, and the third housing part 230 may surround at least some of the space between the first housing part 210 and the second housing part 220. The first housing part 210 (e.g., first plate or first cover part) may constitute the first surface 200A, the first region 2001, and the second region 2002. The first housing part 210 may include a glass plate including various coating layers or a polymer plate. The first region 2001 may be formed adjacent to one long edge of the first housing part 210, and the second region 2002 may be formed adjacent to the other long edge of the first housing part 210. The second housing part 220 (e.g., second cover part) may constitute the second surface 200B, the third region 2003, and the fourth region 2004.

The second housing part 220 may include a first cover member 221 (e.g., a second plate) and a second cover member 222 (e.g., a third plate). The first cover member 221 and/or the second cover member 222 may be made of coated or tinted glass, ceramic, polymer, metal, or a combination thereof.

As another example, the first cover member 221 and/or the second cover member 222 may include aluminum, an aluminum alloy, magnesium, a magnesium alloy, or an alloy including iron (e.g., stainless steel).

The second surface 200B may be formed by the first cover member 221 and the second cover member 222.

The third region 2003 may be formed by the first cover member 221. The third region 2003 may be formed adjacent to one edge of the first cover member 221 in correspondence to the first region 2001.

The fourth region 2004 may include a fifth region 2005 formed by the first cover member 221. The fifth region 2005 may be formed adjacent to the other edge of the first cover member 221 in correspondence to a portion of the second region 2002. The fourth region 2004 may include a sixth region 2006 formed by the third housing part 230 in correspondence to a portion of the second region 2002. The outer surface of the fifth region 2005 and the outer surface of the sixth region 2006 may be smoothly connected. In some embodiments, the sixth region 2006 may be formed by the first cover member 221 or the second cover member 222 of the second housing part 220. In a certain embodiment, the first cover member 221 and the second cover member 222 may be integrally formed.

The third housing part 230 may be coupled to the first housing part 210 and the second housing part 220, and may include a metal and/or a polymer. In some embodiments, the first cover member 221 or second cover member 222 of the second housing part 220 may be integrally formed with the third housing part 230, and may include the same material as the third housing part 230 (e.g., metal material such as aluminum).

The electronic device 100 may include at least one of a display 101, audio modules 102, 103, 104, and 105, sensor modules 106 and 107, camera modules 108, 109, 110, and 111, a light emitting module 112, an input module 113, and connector modules 114 and 115. Alternatively, the electronic device 100 may omit at least one of the above components (e.g., the input module 113) or may additionally include other components.

As used herein, the term "module" may include a unit implemented in hardware, software or firmware, and may be used interchangeably with terms such as logic, logic block, component, or circuit. A module may be an integrally formed element, or a minimum unit or part thereof that performs one or more functions.

The display 101 may be visually exposed through at least some of the first housing part 210 (e.g., upper portion). In some embodiments, the edge of the display 101 may be formed to be substantially the same as the shape of an adjacent periphery of the first housing part 210.

In some embodiments, to expand the exposed area of the display 101, the distance between the outer periphery of the display 101 and the outer periphery of the first housing part 210 may be formed to be substantially the same.

A touch sensing circuit, a pressure sensor capable of measuring the strength (pressure) of a touch, and/or a digitizer detecting a stylus pen operating in a magnetic field may be coupled to, included in, or placed adjacent to the display 101.

The audio modules 102, 103, 104, and 105 may include a first audio module 102 associated with a first microphone, a second audio module 303 associated with a second microphone, a third audio module 104 associated with a first speaker, and/or a fourth audio module 105 associated with a second speaker. The first audio module 102 may include the first microphone located inside the electronic device 100, and a first microphone hole formed in the side surface 200C (or third housing part 230) of the housing 200 in correspondence to the first microphone. The second audio module 103 may include the second microphone located inside the electronic device 100, and a second microphone hole formed in the second surface 200B of the housing 200 (or first cover member 221 of the second housing part 220) in correspondence to the second microphone. The third audio module 104 may include the first speaker located inside the electronic device 100, and a first speaker hole formed in the side surface 200C (or third housing part 230) of the housing 200 in correspondence to the first speaker. The fourth audio module 105 may include the second speaker (e.g., a call receiver) located inside the electronic device 100, and a second speaker hole (e.g., a call receiver hole) formed in the first surface 200A (or first housing part 210) of the housing 200 in correspondence to the second speaker. In some embodiments, the electronic device 100 may identify the direction of a sound by using a plurality of microphones. In some embodiments, at least one speaker hole and at least one microphone hole may be implemented as one hole. In some embodiments, a speaker such as a piezo speaker may be implemented without a speaker hole.

The sensor modules 106 and 107 may generate an electrical signal or data value corresponding to an internal operating state of the electronic device 100 or an external environmental state. The first sensor module 106 may include a proximity sensor that generates a signal regarding the proximity of an external object based on light passing through a region of the first surface 200A of the housing 200, and/or an illuminance sensor for sensing external illuminance. The second sensor module 107 may include a fingerprint sensor for detecting information about a fingerprint based on light passing through a region of the first surface 200A. As another example, the second sensor module 107 may include an ultrasonic fingerprint sensor using ultrasonic waves. A sensor module may be positioned to correspond to the second surface 200B of the housing 200.

A sensor module of the electronic device 100 may include at least one of a gesture sensor, a gyro sensor, a barometric pressure sensor, a magnetic sensor, an accelerometer sensor, a grip sensor, a color sensor, an infrared (IR) sensor, a biometric sensor (e.g., a heart rate monitor (HRM) sensor), a temperature sensor, a humidity sensor, or an illuminance sensor.

The camera modules 108, 109, 110, and 111 may include a first camera module 108 and/or a plurality of second camera modules 109, 110, and 111. The first camera module 108 may generate an image signal based on external light received through the first surface 200A of the housing 200. The plurality of second camera modules 109, 110, and 111 may generate an image signal based on external light received through the second surface 200B of the housing 200.

The second cover member 222 of the second housing 220 may be positioned in correspondence to the plurality of second camera modules 109, 110, and 111. The second cover member 222 may include transparent regions aligned with the plurality of second camera modules 109, 110 and 111. The plurality of second camera modules 109, 110 and 111 may generate an image signal based on external light received through the transparent regions. The region of the second cover member 222 other than the transparent areas aligned with the plurality of second camera modules 109, 110, and 111 may be formed to be opaque.

The light emitting module 112 may include a light source for at least some of the plurality of second camera modules 109, 110, and 111. The light emitting module 112 (e.g., a flash) may include a light source such as a light emitting diode (LED) or a xenon lamp. The first cover member 221 of the second housing part 220 may include a transparent region aligned with the light emitting module 112. The light output from the light emitting module 112 may pass through the transparent region of the first cover member 221. The region of the first cover member 221 other than the transparent region aligned with the light emitting module 112 may be formed to be opaque. In some embodiments, the transparent region aligned with the light emitting module 112 may also be replaced with an opening.

The first camera module 108 and/or the plurality of second camera modules 109, 110, and 111 may include at least one lens, an image sensor, and/or an image signal processor (ISP). The second camera modules 109, 110, and 111 may include an IR camera module 109, a wide-angle camera module 110, or a telephoto camera module 111.

The input module 113 may include at least one key input device. The key input devices may be located on the side surface 200C (or, third housing part 230) of the housing 200. Alternatively, the electronic device 100 may not include some or all of the key input devices, and instead, may utilize input devices another form such as a soft key on the display 101.

The location, number, or shape of the input module 113 may vary, and the input module 113 may include a sensor module.

In some embodiments, the electronic device 100 may further include a light emitting module (e.g., a light source) positioned inside the electronic device 100 in correspondence to the first surface 200A. The light emitting module may provide information about the state of the electronic device 100 in the form of light (e.g., various status information such as remaining battery level, connection status with an external electronic device like a charger, or message reception). In some embodiments, the light emitting module may provide a light source associated with the operation of the first camera module 108. The light emitting module may include an LED, an IR LED, or a xenon lamp.

The connector modules (or interface terminal modules, connection terminal modules, etc.) 114 and 115 may include a first connector module 114 for connection with an external electronic device, and a second connector module 115 for connection with an external memory. The electronic device 100 may transmit and/or receive power and/or data to and/or from an external electronic device connected to the first connector module 114. The first connector module 114 may include an external connector (e.g., USB connector) located inside the electronic device 100, and a first connector hole formed in the side surface 200C (or third housing part 230) of the housing 200 in correspondence to the external connector. The second connector module 115 may include a memory connector (or memory socket) located inside the electronic device 100, and a second connector hole formed in the side surface 200C (or third housing part 230) of the housing 200 in correspondence to the memory connector. The second connector hole may be covered by a cover.

At least one electronic component (e.g., the first camera module 108, the first sensor module 106, and/or the second sensor module 107) may be disposed under at least some of the screen (e.g., screen display area or active area) of the display 101. The at least one electronic component may be located on the rear surface of the screen or below (or beneath) the screen.

In some embodiments, at least one electronic component may be arranged in a recess formed on the rear surface of the display 101 and positioned inside the electronic device 100. The positions of the at least one electronic component are not visually distinguishable (or exposed), and the at least one electronic component may perform a related function. For example, when viewed from above the screen (e.g., viewed in negative z-axis direction), the first camera module 108 may be disposed to overlap at least a portion of the screen so as to capture an image of an external subject without being exposed to the outside. When viewed from above the screen, the first sensor module 106 and/or the second sensor module 107 may be disposed to overlap at least a portion of the screen so as to perform corresponding sensing functions without being exposed to the outside.

The region of the display 101 at least partially overlapped with at least one electronic component may include pixel and/or wiring structures different from those of other regions. For example, the region of the display 101 at least partially overlapped with at least one electronic component may have a different pixel density compared to other regions. The pixel structure and/or wiring structure formed in the region of the display 101 at least partially overlapped with at least one electronic component may reduce the loss of various types of signals (e.g., light or ultrasound) related to the at least one electronic component passing between the outside and the at least one electronic component.

Alternatively, a plurality of pixels may be not disposed in the region of the display 101 at least partially overlapped with the at least one electronic component. The at least one electronic component may be aligned with an opening (e.g., through hole or notch) formed in the display 101 and be positioned inside the electronic device 100.

Figure 3:
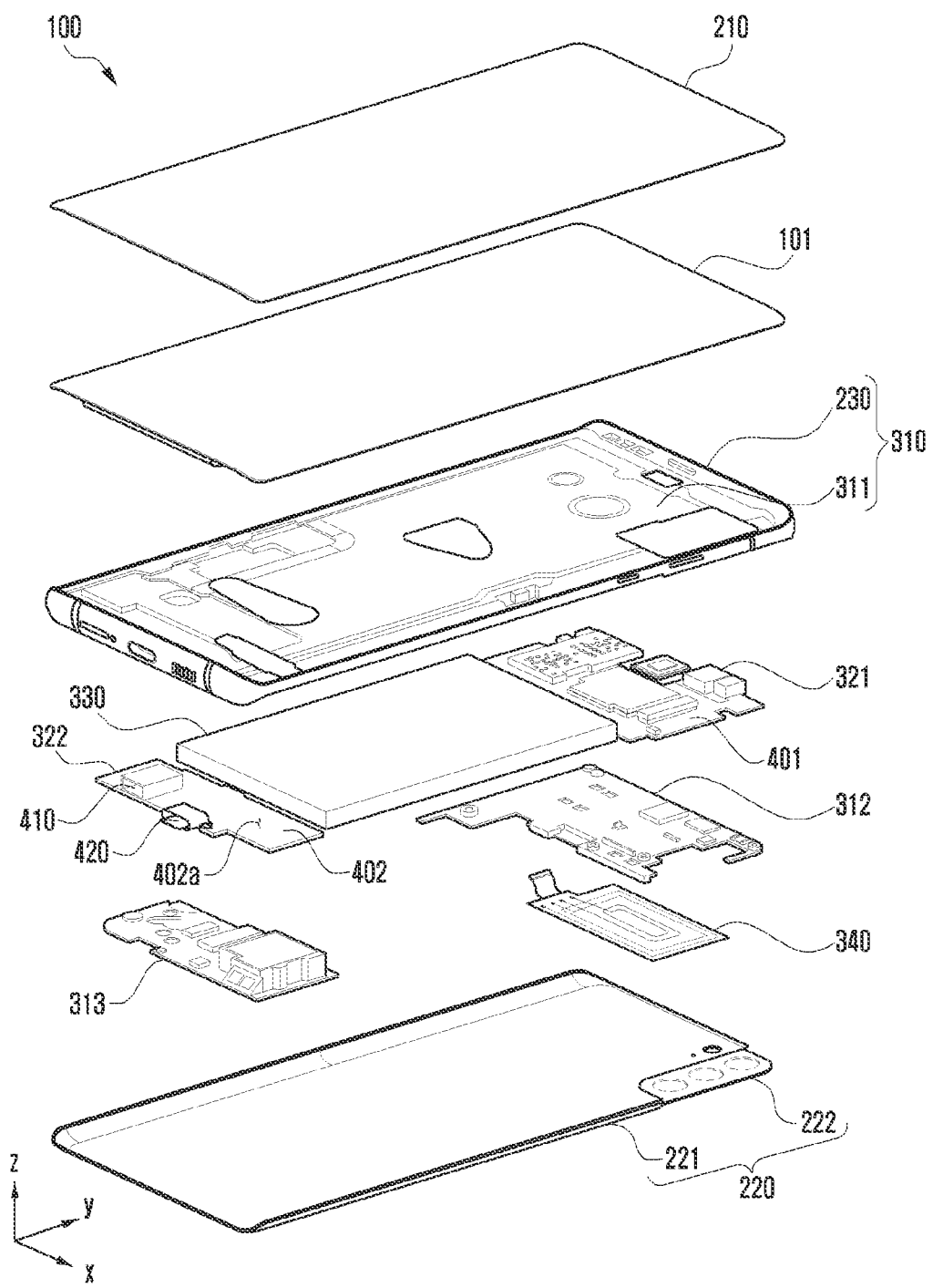
FIG. 3 illustrates an exploded view of the electronic device of FIG. 1, according to an embodiment.

FIG. 3 illustrates an exploded view of the electronic device 100 of FIG. 1, according to an embodiment.

Referring to FIG. 3, the electronic device 100 may include a first housing part 210, a second housing part 220, a third housing part 230, a first support member 311, a second support member 312, a third support member 313, a display 101, a first board assembly 321, a second board assembly 322, a battery 330, and/or an antenna structure 340. Alternatively, the electronic device 100 may omit at least one of the above components (e.g., the second support member 312 or the third support member 313), or may additionally include another component.

The first support member 311 may be located inside the electronic device 100 and connected to the third housing part 230, or may be integrally formed with the third housing part 230. The first support member 311 may be made of a metal material and/or a non-metal material (e.g., polymer). The first support member 311 and the third housing part 230 may be collectively referred to as a front case 310. The first support member 311 is a portion of the front case 310 where components such as the display 101, the first board assembly 321, the second board assembly 322, or the battery 330 are disposed, and may contribute to the durability or rigidity (e.g., torsional rigidity) of the electronic device 100. The first support member 311 may be referred to as a support structure (e.g., bracket or mounting plate). The third housing part 230 has a shape that at least partially surrounds the space between the first housing part 210 and the second housing part 220, and may be referred to as a bezel structure hereinafter.

The display 101 may be positioned between the support structure 311 and the first housing part 210, and may be coupled to one surface of the support structure 311. The first board assembly 321 and the second board assembly 322 may be positioned between the support structure 311 and the second housing part 220, and may be coupled to the other surface of the support structure 311. The battery 330 may be positioned between the support structure 311 and the second housing part 220, and may be disposed in the support structure 311.

The first board assembly 321 may include a first PCB 401. The first board assembly 321 may include various electronic components electrically connected to the first PCB 401. The electronic components may be disposed on the first PCB 401 or may be electrically connected to the first PCB 401 through an electrical path such as a cable or a flexible PCB (FPCB). For example, the electronic components may include a microphone, a speaker, a sensor module, a light emitting module, and/or an input module.

The second board assembly 322 may be disposed to be spaced apart from the first board assembly 321 with the battery 330 interposed therebetween when viewed from above the first housing part 210 (e.g., viewed in negative z-axis direction). The second board assembly 322 may include a second PCB 402 electrically connected to the first PCB 401 of the first board assembly 321. The second board assembly 322 may also include various electronic components electrically connected to the second PCB 402. These electronic components may be arranged on the second PCB 402 or may be electrically connected to the second PCB 402 through an electrical path such as a cable or FPCB. For example, the electronic components include a first connector 410 (e.g., an external connector such as a USB connector), and/or a second connector 420 (e.g., a memory connector). The first connector 410 may be referred to as a first interface terminal, and the second connector 420 may be referred to as a second interface terminal.

In some embodiments, the first board assembly 321 or the second board assembly 322 may include a main PCB, a slave PCB disposed to partially overlap the main PCB, and/or an interposer substrate between the main PCB and the slave PCB.

The battery 330 supplies power to at least one component of the electronic device 100, and may include a non-rechargeable primary cell, a rechargeable secondary cell, and/or a fuel cell. The battery 330 may be integrally disposed inside the electronic device 100, or may be disposed to be attachable to and detachable from the electronic device 100.

The second support member 312 may be positioned between the support structure 311 and the second housing part 220, and may be coupled to the support structure 311 by using a fastening element such as a bolt. At least some of the first board assembly 321 may be positioned between the support structure 311 and the second support member 312, and the second support member 312 may protect the first board assembly 321 by covering it. The third support member 313 may be positioned to be spaced apart from the second support member 312 with the battery 330 interposed therebetween when viewed from above the second housing part 220 (e.g., viewed in positive z-axis direction). The third support member 313 may be positioned between the support structure 311 and the second housing part 220, and may be coupled to the support structure 311 by using a fastening element such as a bolt. At least some of the second board assembly 322 may be positioned between the support structure 311 and the third support member 313, and the third support member 313 may protect the second board assembly 322 by covering it. The second support member 312 and/or the third support member 313 may be made of a metal material and/or a non-metal material (e.g., a polymer). In some embodiments, the second support member 312 may serve as an electromagnetic shield for the first board assembly 321, and the third support member 313 may serve as an electromagnetic shield for the second board assembly 322. At least a portion (e.g., a conductive portion) of the support structure 311 included in the front case 310 may also serve as an electromagnetic shield. In some embodiments, the second support member 312 and/or the third support member 313 may be referred to as a rear case.

Alternatively, an all-in-one board assembly including the first board assembly 321 and the second board assembly 322 may be implemented. For example, when viewed from above the second housing part 220 (e.g., viewed in positive z-axis direction), the board assembly may include a first part and a second part positioned to be spaced apart from each other with the battery 330 interposed therebetween, and a third part extended between the battery 330 and the bezel structure 230 and connecting the first part and the second part. In this case, an all-in-one support member including the second support member 312 and the third support member 313 may be implemented.

The antenna structure 340 may be disposed between the second support member 312 and the second housing part 220. In some embodiments, the antenna structure 340 may be disposed between the battery 330 and the second housing part 220. The antenna structure 340 may be disposed between the second support member 312, the third support member 313, the battery 330, and the second housing part 220. The antenna structure 340 may be implemented in the form of a film such as an FPCB. The antenna structure 340 may include at least one conductive pattern used as a loop-type radiator. The at least one conductive pattern may include a planar spiral conductive pattern (e.g., a planar coil or a pattern coil). At least one conductive pattern included in the antenna structure 340 may be electrically connected to a wireless communication circuit (or wireless communication module) disposed in the first board assembly 321. For example, the at least one conductive pattern may be utilized for short-range wireless communication such as near field communication (NFC). As another example, the conductive pattern may be utilized for magnetic secure transmission (MST) for transmitting and/or receiving a magnetic signal. In some embodiments, at least one conductive pattern included in the antenna structure 340 may be electrically connected to a power transmission and reception circuit disposed in the first board assembly 321. The power transmission and reception circuit may wirelessly receive power from an external electronic device through a conductive pattern or may wirelessly transmit power to an external electronic device. The power transmission and reception circuit may include a power management module, and may include a power management integrated circuit (PMIC) or a charger integrated circuit (IC). The power transmission and reception circuit may charge the battery 250 by using power wirelessly received through the conductive pattern.

The electronic device 100 may also include various components. Although not possible to enumerate all of such components due to variations according to the convergence trend of the electronic device 100, components comparable to the above-mentioned components may also be included in the electronic device 100. Additionally, some of the above-described components may be excluded or replaced with other components.

Figure 4:
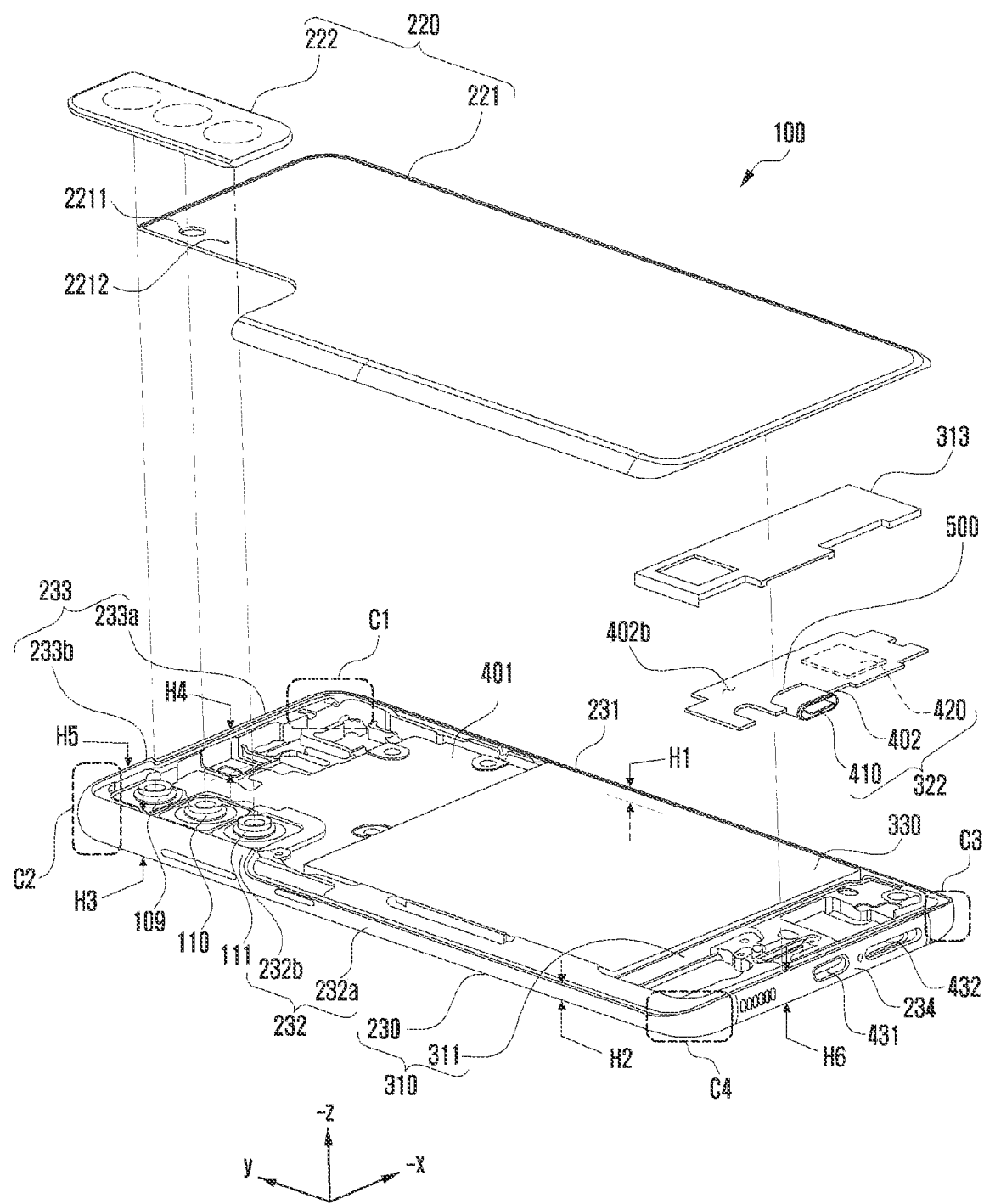
FIG. 4 illustrates an exploded view of the electronic device of FIG. 1, according to an embodiment.
Figure 5:
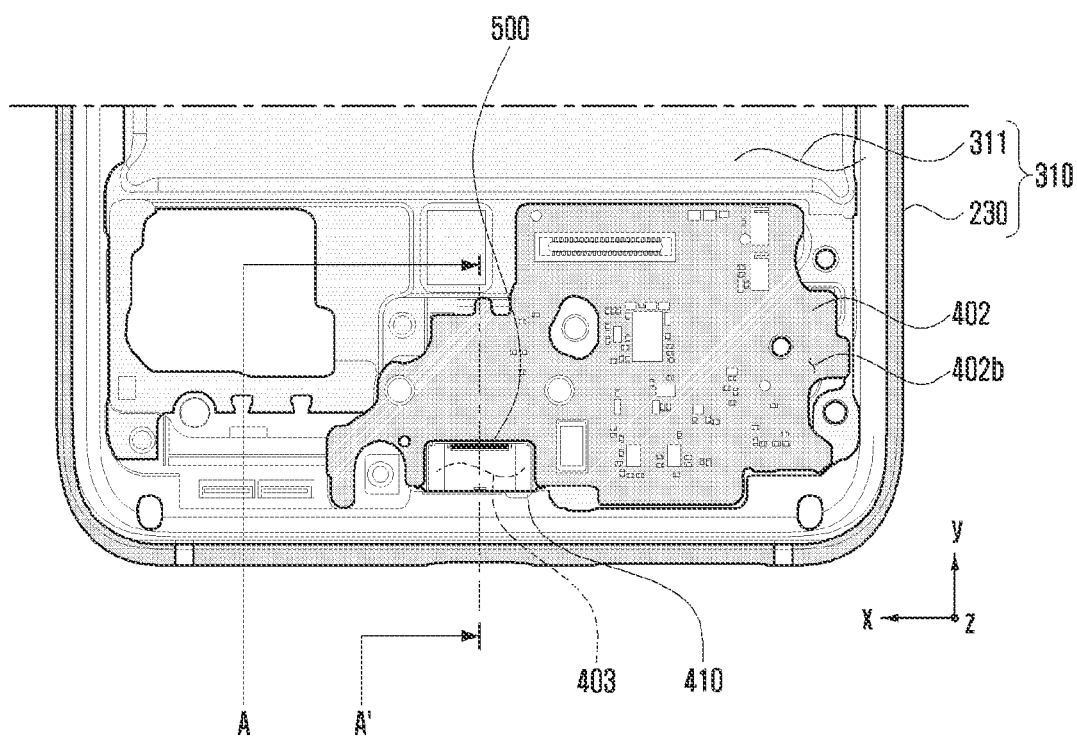
FIG. 5 illustrates a part of the electronic device of FIG. 1, according to an embodiment.

FIG. 4 illustrates an exploded view of the electronic device of FIG. 1, according to an embodiment. FIG. 5 illustrates a part of the electronic device of FIG. 1, according to an embodiment.

Referring to FIGS. 4 and 5, the electronic device 100 may include a second housing part 220, a front case 310, a third support member 313, a first PCB 401, a second PCB 402, a plurality of second camera modules 109, 110 and 111, and/or a battery 330. The second housing part 220 may include a first cover member 221 and a second cover member 222. The front case 310 may include a support structure 311 and a bezel structure 230. The third support member 313 (and/or the second support member 312 as illustrated in FIG. 3) is a part that constitutes a support structure assembly in the electronic device 100 together with the support structure 311 of the front case 310, and may be positioned to face the second housing part 220 in correspondence to the front case 310. Hereinafter, the third support member 313 (and/or the second support member 312 in FIG. 3) may be referred to as a rear case.

The first PCB 401, the second PCB 402, the battery 330, and/or the plurality of second camera modules 109, 110 and 111 may be disposed at or coupled to the support structure 311 between the support structure 311 and the second housing part 220. At least some of the second PCB 402 may be positioned between the support structure 311 of the front case 310 and the rear case 313, and the rear case 313 may protect the second PCB 402 by covering it.

The bezel structure 230 may include a first bezel part 231, a second bezel part 232, a third bezel part 233, and/or a fourth bezel part 234. The first bezel part 231 and the second bezel part 232 may be spaced apart from each other and extend in parallel. The third bezel part 233 may connect one end of the first bezel part 231 and one end of the second bezel part 232. The fourth bezel part 234 may connect the other end of the first bezel part 231 and the other end of the second bezel part 232, and may be spaced apart from the third bezel part 233 and extend in parallel therewith.

A first corner portion C1 at which the first bezel part 231 and the third bezel part 233 are connected, a second corner portion C2 at which the second bezel part 232 and the third bezel part 233 are connected, a third corner portion C3 at which the first bezel part 231 and the fourth bezel part 234 are connected, and/or a fourth corner portion C4 at which the second bezel part 232 and the fourth bezel part 234 are connected, may be formed in a round shape. The first bezel part 231 and the second bezel part 232 have a first length, and the third bezel part 233 and the fourth bezel part 234 may have a second length smaller than the first length. Alternatively, the first length and the second length may be formed to be substantially the same.

The support structure 311 may be located inside the electronic device 100 and connected to the bezel structure 230, or may be integrally formed with the bezel structure 230. The first bezel part 231 or the first outer surface of the electronic device 100 formed by the first bezel part 231 may have a first height (or first thickness) H1. The second bezel part 232 may include a first part 232a and a second part 232b. The second bezel part 232 or the second outer surface of the electronic device 100 formed by the second bezel part 232 may include a region of a second height H2 by the first part 232a and a region of a third height (or second thickness) H3 by the second part 232b. The third bezel part 233 may include a third part 233a and a fourth part 233b. The third bezel part 233 or the third outer surface of the electronic device 100 formed by the third bezel part 233 may include a region of a fourth height H4 by the third part 233a and a region of a fifth height H5 by the fourth part 233b. The fourth bezel part 234 or the fourth outer surface of the electronic device 100 formed by the fourth bezel part 234 may have a sixth height H6. The first height H1 and the fourth height H4 may be the same. The third height H3, the fifth height H5, and the sixth height H6 may be the same. The second height H2 may be smaller than the third height H3. The fourth height H4 may be smaller than the fifth height H5. The first height H1 may be smaller than the fourth height H4 or equal to the fourth height H4. The second height H2 may be smaller than the first height H1 or equal to the first height H1.

The first corner portion C1 may be formed by connecting the first bezel part 231 and the third part 233a of the third bezel part 233. When the first height H1 is smaller than the fourth height H4, the first corner portion C1 or the first corner outer surface of the electronic device 100 formed by the first corner portion C1 may be in a form that gradually increases from the first height H1 to the fourth height H4. When the first height H1 and the fourth height H4 are the same, the first corner portion C1 or the first corner outer surface of the electronic device 100 formed by the first corner portion C1 may be of the first height H1 (or fourth height H4).

The second corner portion C2 may be formed by connecting the second part 232b of the second bezel part 232 and the fourth part 233b of the third bezel part 233. The second corner portion C2 or the second corner outer surface of the electronic device 100 formed by the second corner portion C2 may be of the third height H3 (or fifth height H5). The third corner portion C3 or the third corner outer surface of the electronic device 100 formed by the third corner portion C3 may be in a form that gradually increases from the first height H1 to the sixth height H6. The fourth corner portion C4 or the fourth corner outer surface of the electronic device 100 formed by the fourth corner portion C4 may be in a form that gradually increases from the second height H2 to the sixth height H6.

The second camera modules 109, 110, and 111 may be positioned closer to the second bezel part 232 than the first bezel part 231 when viewed from above the second housing part 220 (e.g., viewed in positive z-axis direction). The second camera modules 109, 110, and 111 may be positioned closer to the third bezel part 233 than the fourth bezel part 234 when viewed from above the second housing part 220. The second camera modules 109, 110, and 111 may be located close to the second corner portion C2 among the first corner portion C1, the second corner portion C2, the third corner portion C3, and the fourth corner portion C4, and may be arranged in a direction from the third bezel part 233 to the fourth bezel part 234 (e.g., negative y-axis direction). The number or position of the second camera modules may vary without being limited to the embodiment of FIG. 4.

The second cover member 222 of the second housing part 220 may be positioned in correspondence to the second camera modules 109, 110, and 111. For example, the second cover member 222 may be positioned in correspondence to the second part 232b of the second bezel part 232, the fourth part 233b of the third bezel part 233, and the second corner portion C2.

The first cover member 221 of the second housing part 220 may include a transparent region (or opening) 2211 positioned in correspondence to the light emitting module 112. In some embodiments, the light emitting module 112 may be positioned in correspondence to the second cover member 222, and the second cover member 222 may include a transparent region (or opening) positioned in correspondence to the light emitting module 112. The first cover member 221 may include a microphone hole 2212 positioned in correspondence to the second microphone. In some embodiments, the microphone hole 2212 may be formed in the second cover member 222.

A first connector (or a first interface terminal) 410 and a second connector (or a second interface terminal) 420 may be disposed on the second PCB 402.

The front case 310 includes a first connector hole 431 corresponding to the first connector 410 (e.g., a USB connector), and a second connector hole 432 corresponding to the second connector (e.g., a memory card connector or a memory card slot). The first connector hole 431 and the second connector hole 432 may be positioned on the side of the fourth bezel part 234 of the bezel structure 230. When viewed toward the fourth bezel part 234 (e.g., when viewed in positive y-axis direction), the second connector hole 432 may be positioned between the first connector hole 431 and the third corner portion C3. When viewed toward the fourth bezel part 234, the distance by which the first connector hole 431 is spaced apart from the third corner portion C3 and the distance by which the first connector hole 432 is spaced apart from the fourth corner portion C4 may be substantially the same. The first connector 410 and the position of the first connector hole 431 corresponding to the first connector 410 may varied without being limited to the illustrated example. The second connector 420 and the positions of the second connector hole 432 corresponding to the second connector 420 may be varied without being limited to the illustrated example.

The second PCB 402 may include, for example, a first surface 402a (as illustrated in FIG. 3) and a second surface 402b facing in a direction opposite to the first surface 402a. The first surface 402a may face the support structure 311. The second surface 402b may face the rear case 313.

The first connector 410 may be a mid-mount type (or a sink type) connector. For example, the second PCB 402 may include a notch 403, and a part of the first connector 410 may be positioned at the notch 403. The notch 403 may be an opening penetrating between the first surface 402a and the second surface 402b of the second PCB 402, and may be in the form of a cut in a direction from the fourth bezel part 234 to the third bezel part 233 (e.g., positive y-axis direction). When the first connector 410 is disposed on the second PCB 402 by use of the notch 403, a part of the first connector 410 may protrude with respect to the first surface 402a and/or the second surface 402b of the second PCB 402.

The second connector 420 may be a surface mount type connector. The second connector 420 may be disposed on the first surface 402a of the second PCB 402. In some embodiments, the first connector 410 may be a surface mount type connector, and may be disposed on the first surface 402a of the second PCB 402. In this case, the notch 403 may be omitted.

The second connector 420 may have a structure in which a tray (or an adapter) can be inserted. An external storage medium may be mounted on the first connector 420 by using a tray. The tray may be a device for electrically or mechanically connecting an external storage medium to the second connector 420. The tray on which an external storage medium is arranged is inserted into the second connector hole 432, and a plurality of terminals of the external storage medium and a plurality of terminals of the second connector 420 may be brought in physical contact with each other to thereby conduct electricity. The external storage medium may include a subscriber identification module (SIM) card or a universal SIM (USIM) card. As another example, the external storage medium may include a memory card such as a compact flash (CF), a multi-media card (MMC), a smart media card (SMC), a secure disk (SD), or a memory stick.

At a first assembly operation, the second board assembly 322 including the first connector 410, the second connector 420, and the second PCB 402 may be moved to a designated position of the front case 310. For example, the second PCB 402 may be positioned to be substantially parallel to the first surface (or front surface) 200A in FIG. 1 or the second surface (or rear surface) 200B in FIG. 2 inside the electronic device 100.

At a second assembly operation, the rear case 313 may be positioned to cover the second board assembly 322.

At a third assembly operation, the second housing part 220 may be coupled to the front case 310. For example, adhesive materials of various polymers may be positioned between the second housing part 220 and the front case 310.

The first assembly operation may include coupling the second board assembly 322 with the support structure 311 by using a fastening element such as a bolt. The second assembly operation may include coupling the rear case 313 with the second board assembly 322 and/or the support structure 311 by using a fastening element such as a bolt. An assembly device may be used in first assembly operation, second assembly operation, and/or the third assembly operation.

The assembly device used in first assembly operation may move the second board assembly 322 while supporting and holding it, and may include a jig or a fixture. The assembly device may reduce assembly errors or assembly defects with respect to the second board assembly 322, thereby contributing to mass production. Due to the first assembly operation using the assembly device, the first connector 410 may be aligned in correspondence to the first connector hole 431 of the fourth bezel part 234, and the second connector 420 may be aligned in correspondence to the second connector hole 432 of the fourth bezel part 234.

The first connector 410 may include a seal member. The seal member may include a flexible material such as rubber or an elastic material. When the second board assembly 322 is disposed at a designated position of the front case 310, the seal member may be in elastic contact with a designated portion (or, designated region) of the hole structure forming the first connector hole 431 of the front case 310, so that it is possible to secure sealing performance (e.g., waterproof performance) preventing foreign substances such as water or dust from entering the inside of the electronic device 100 between the first connector 410 and the hole structure forming the first connector hole 431.

The electronic device 100 may include a cover that can be fitted into the second connector hole 420, and this cover can reduce the inflow of water or dust through the second connector hole 420. In some embodiments, the waterproof structure between the second connector 420 and the hole structure of the front case 310 forming the second connector hole 432 may be implemented substantially the same as the waterproof structure between the first connector 410 and the hole structure of the front case 310 forming the first connector hole 431.

When an assembly device such as a jig moves the second board assembly 322 to a designated position of the front case 310 at the first assembly operation, the assembly device may apply a force to the first connector 410. The first connector 410 may include a portion protruding with respect to the second surface 402b of the second PCB 402 (referred to as protrusion 500). The protrusion 500 may be a portion that receives a force from the assembly device (e.g., pressurized portion) due to the movement of the assembly device at first assembly operation.

Figure 6:
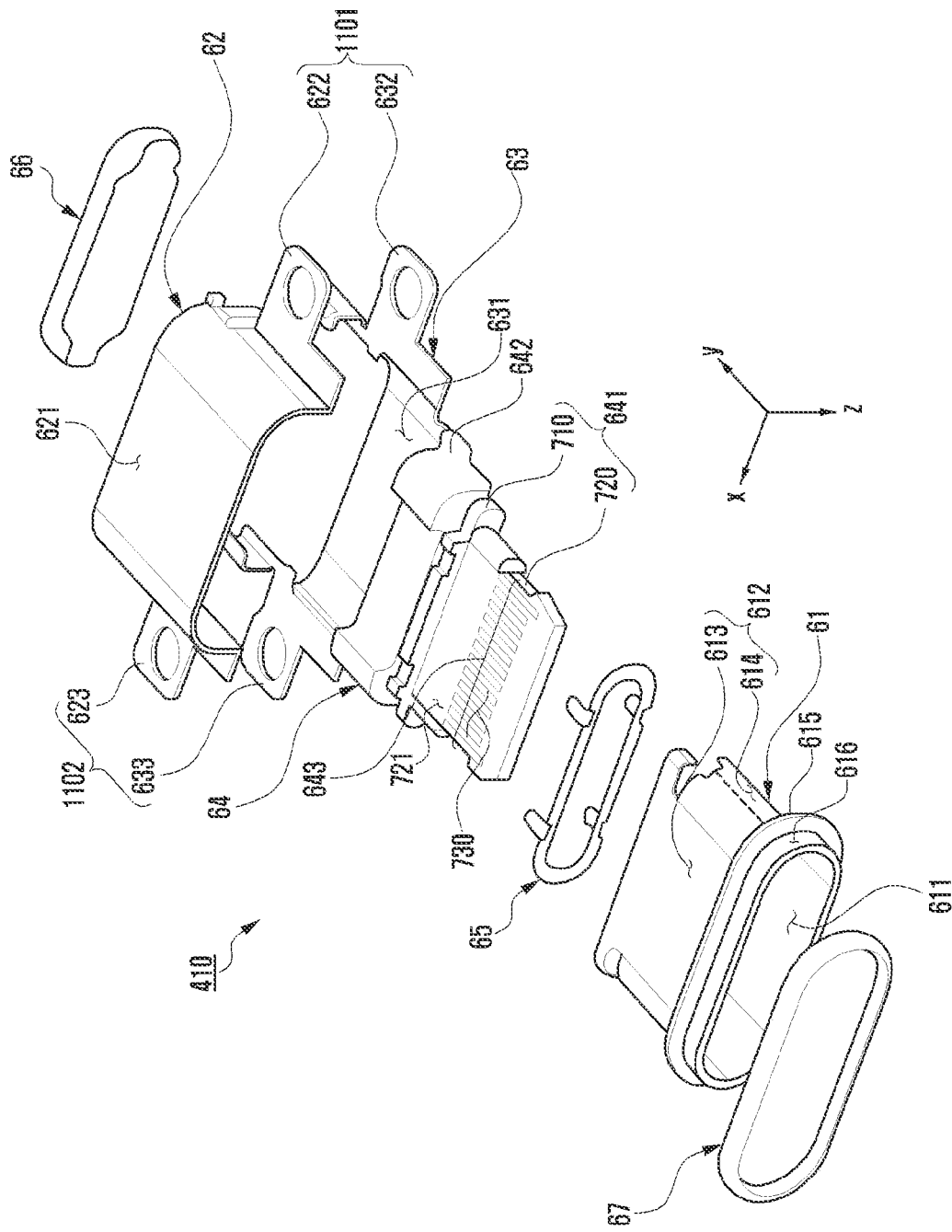
FIG. 6 illustrates an exploded view of a first connector according to an embodiment.
Figure 7:
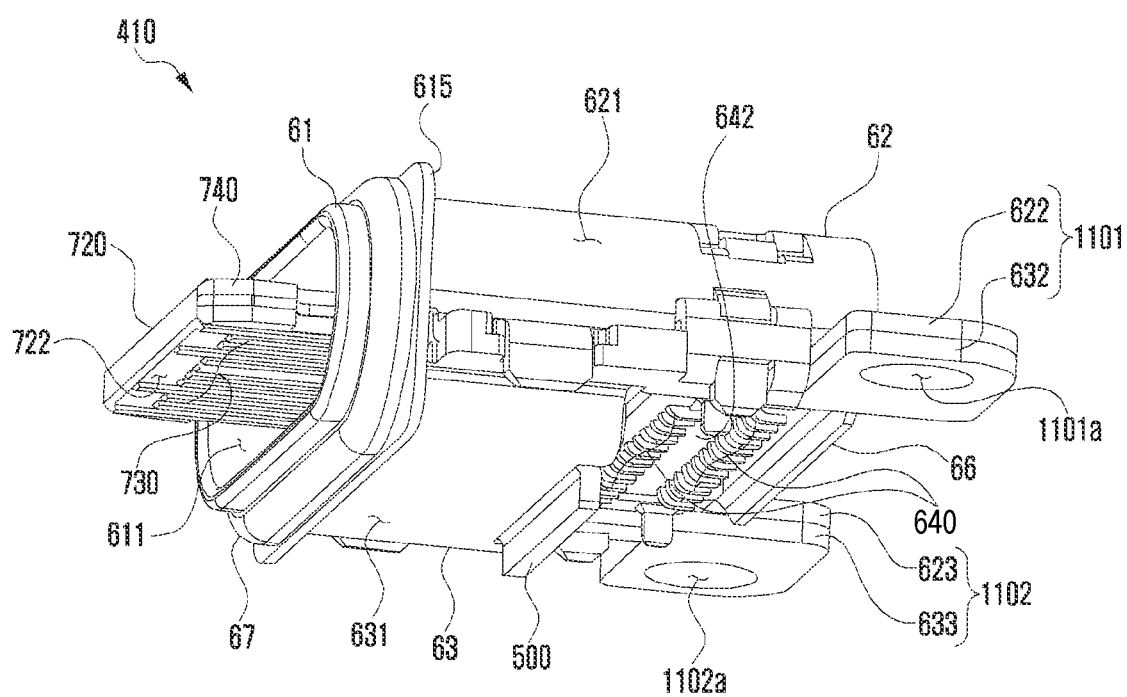
FIGS. 7 and 8 illustrate the first connector of FIG. 6, according to an embodiment.
Figure 8:
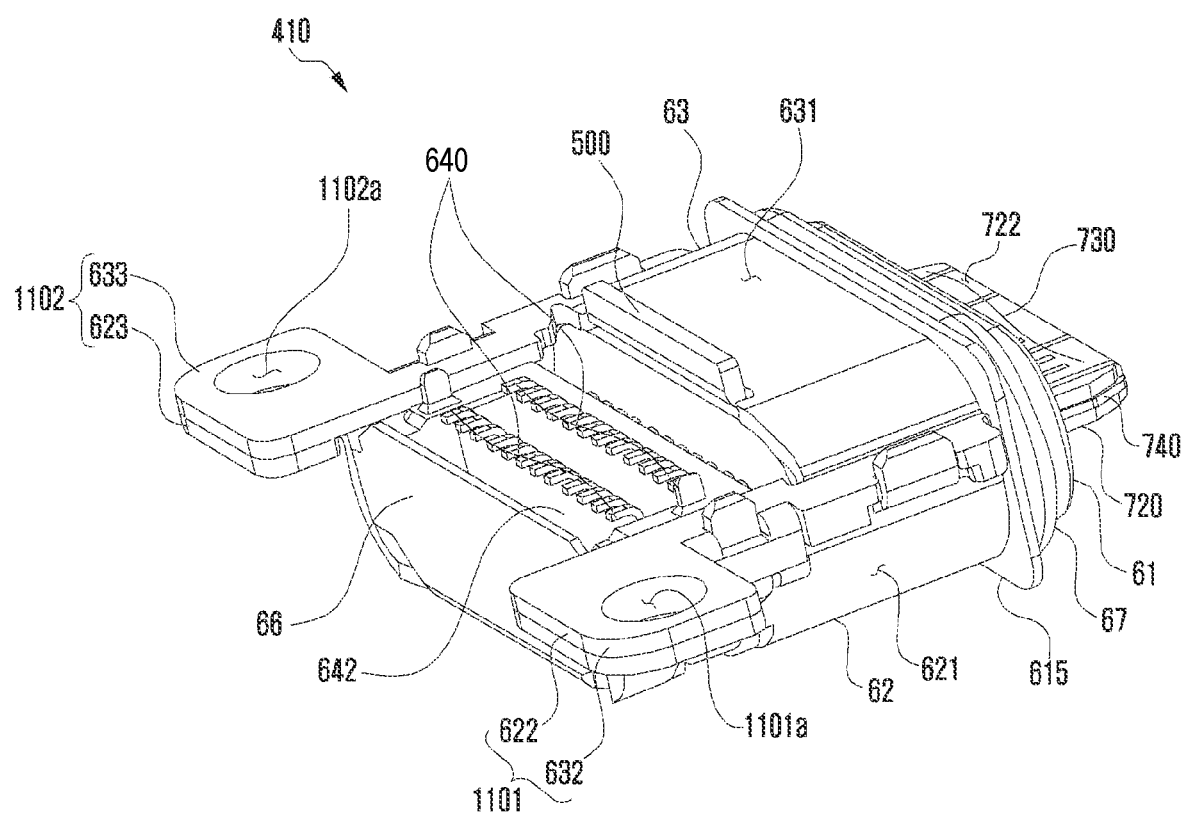
Figure 9:
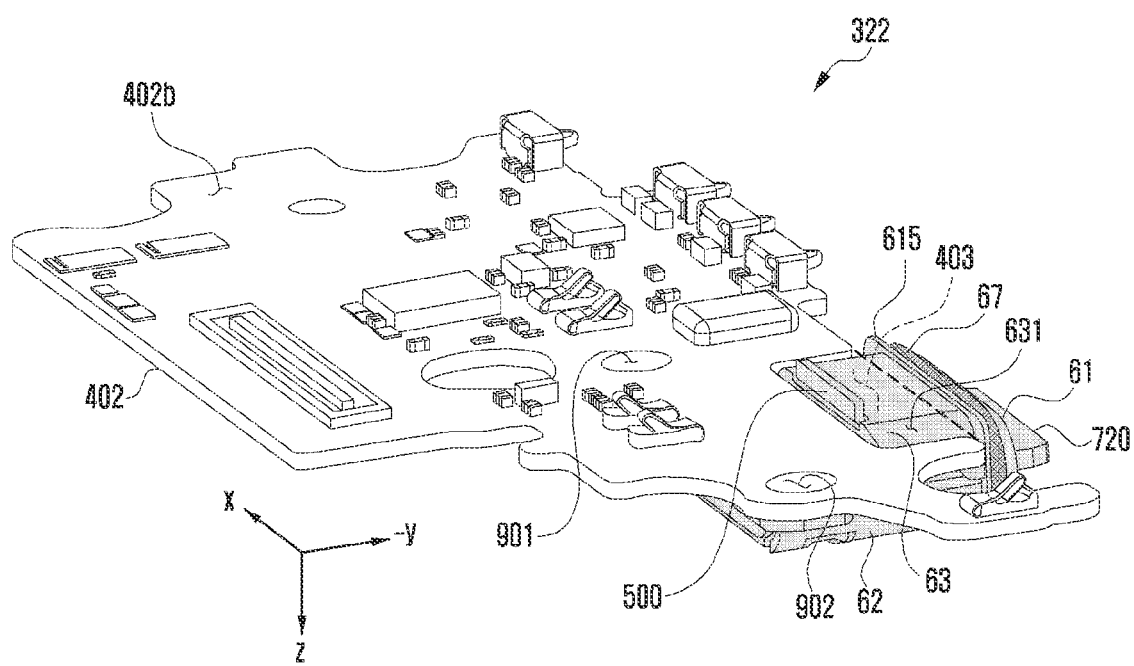
FIG. 9 illustrates a second board assembly according to an embodiment.
Figure 10:
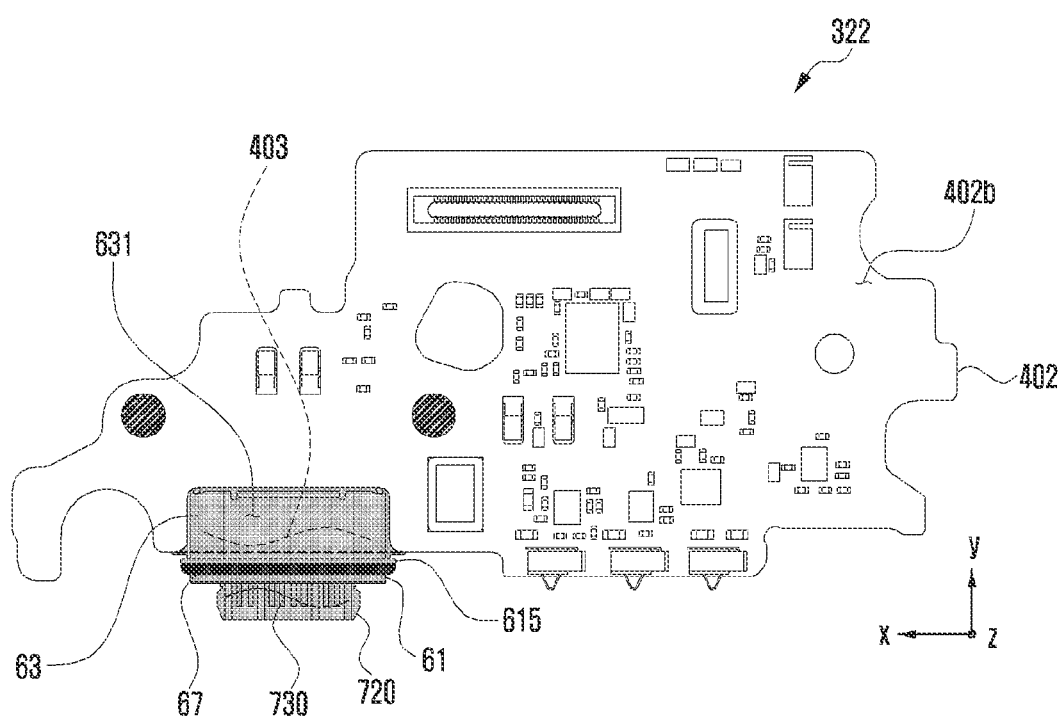
FIG. 10 illustrates the second board assembly of FIG. 9, when viewed toward a second surface of the second PCB, according to an embodiment.
Figure 11:
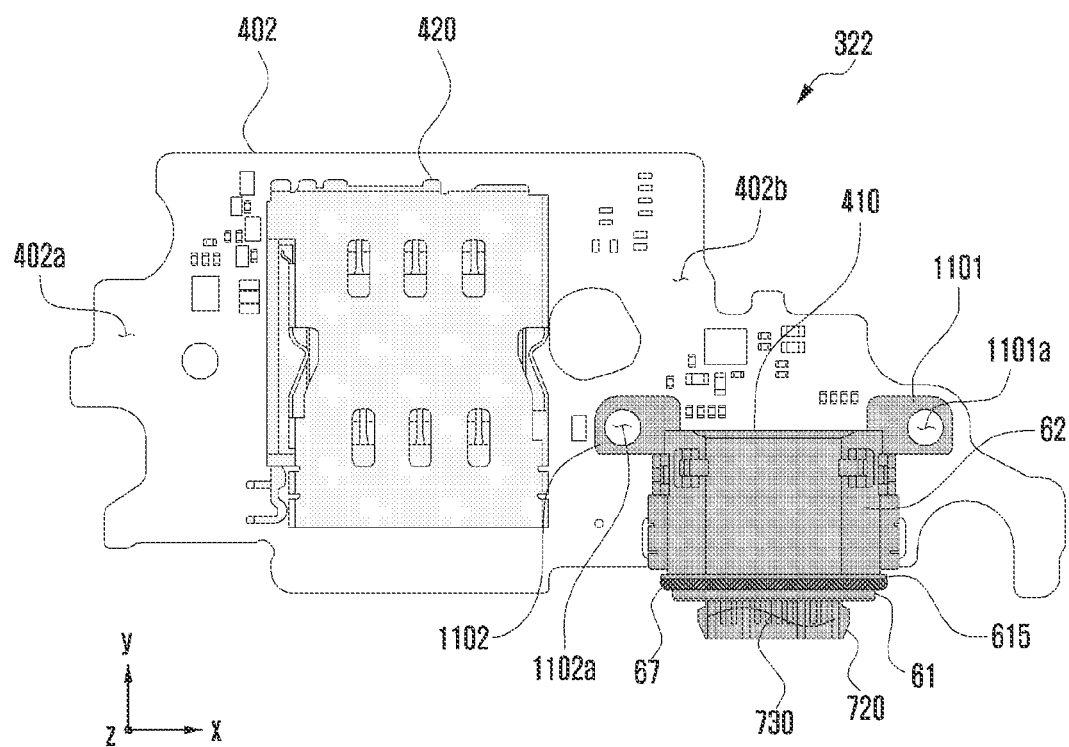
FIG. 11 illustrates the second board assembly of FIG. 9, when viewed toward a first surface of the second PCB, according to an embodiment.

FIG. 6 illustrates an exploded view of a first connector according to an embodiment. FIGS. 7 and 8 illustrate the first connector of FIG. 6, according to an embodiment. FIG. 9 illustrates a second board assembly according to an embodiment. FIG. 10 illustrates the second board assembly of FIG. 9, when viewed toward a second surface of a second PCB, according to an embodiment. FIG. 11 illustrates the second board assembly of FIG. 9, when viewed toward a first surface of a second PCB, according to an embodiment.

Referring to FIGS. 6-9, a first connector 410 may include a shell 61, a first bracket 62, a second bracket 63, a terminal structure (or terminal assembly) 64, a stopper 65, a cover member 66, and/or a seal member 67. The first connector 410 may be a socket connector (or a receptacle) to which a header connector (or a plug) is connectable.

The shell 61 may have a tubular structure including a hollow (or a hollow portion) 611 extended from a first opening on one side to a second opening on the other side. The first opening may be closer to the first connector hole 431 than the second opening, for example. The second opening may be located to be spaced apart from the first opening in a direction in which an external connector is inserted into the first connector 410 (e.g., positive y-axis direction). The shell 61 may include various metal materials such as stainless steel or phosphor bronze. The shell 61 may be manufactured by using sheet metal working or press working. For example, drawing (e.g., deep drawing) may be used as a method of manufacturing the shell 61. The shell 61 may be manufactured by forming a metal plate into a container shape using a punch and a die and then performing external processing such as cutting and bending. The shell 61 manufactured using deep drawing may be implemented in a seamless form. The shell 61 may include a shell inner surface with respect to the hollow 611, and a shell outer surface positioned on the opposite side of the shell inner surface. The shell inner surface and the shell outer surface 612 may be substantially free of a seam in which the two boundaries are connected to each other. The shell 61 may be manufactured by using a variety of other methods.

To mount the first connector 410 to the second PCB 402, the first bracket 62 and the second bracket 63 may have a structure for connecting the first connector 410 and the second PCB 402. The first bracket 62 or the second bracket 63 may include a conductive material and may be manufactured using various methods such as press working. The first bracket 62 or the second bracket 63 may include the same metal material as the shell 61. The first bracket 62 or the second bracket 63 may also include a metal material different from that of the shell 61. A part of the shell 61 may be positioned between the first bracket 62 and the second bracket 63.

The first bracket 62 and the second bracket 63 may be formed to cover the shell outer surface 612 from both sides, respectively. The shell outer surface 612 may include a first region 613 positioned on the side of the first housing part 210 in FIG. 1 of the electronic device 100, and a second region 614 positioned on the side of the second housing part 220 in FIG. 2 of the electronic device 100.

The first bracket 62 may include a first cover part 621 having a shape that at least partially covers the first region 613 of the shell outer surface 612. The second bracket 63 may include a second cover part 631 having a shape that at least partially covers the second region 614 of the shell outer surface 612. The first bracket 62 and the second bracket 63 may be coupled at one boundary side and at the other boundary side between the first region 613 and the second region 614 of the shell outer surface 612, and the coupling structure may be varied. The coupling structure between the first bracket 62 and the second bracket 63 may be in various ways, such as mechanical fastening or bonding using a bonding material. For example, the coupling structure between the first bracket 62 and the second bracket 63 may include a snap-fit.

The first bracket 62 may include a first extension portion 622 extending from the first cover part 621 at one boundary side between the first region 613 and the second region 614 of the shell outer surface 612, and a second extension portion 623 extending from the first cover part 621 at the other boundary side between the first region 613 and the second region 614 of the shell outer surface 612. The first extension portion 622 and the second extension portion 623 may be positioned on opposite sides each other with the first cover part 621 interposed therebetween.

The second bracket 63 may include a third extension portion 632 and a fourth extension portion 633 extended from the second cover part 631 in substantially the same manner as the first extension portion 622 and the second extension portion 623 of the first bracket 62. The first extension portion 622 and the third extension portion 632 may be parallel to the first surface 401a of the second PCB 402, and the third extension portion 632 may be positioned between the first extension portion 622 and the second PCB 402.

A first bracket fixing portion 1101 including the first extension portion 622 and the third extension portion 632 may be fixed at a designated first position on the first surface 402a of the second PCB 402. In some embodiments, the first bracket fixing portion 1101 may be implemented by omitting one of the first extension portion 622 and the third extension portion 632. The second extension portion 623 and the fourth extension portion 633 may be parallel to the first surface 402a of the second PCB 402, and the fourth extension portion 633 may be positioned between the second extension portion 623 and the second PCB 402. The second bracket fixing portion 1102 including the second extension portion 623 and the fourth extension portion 633 may be fixed at a designated second position on the first surface 402a of the second PCB 402. In some embodiments, the second bracket fixing portion 1102 may be implemented by omitting one of the second extension portion 623 and the fourth extension portion 633.

The first bracket fixing portion 1101 and the second bracket fixing portion 1102 may be coupled to the second PCB 402 by using bolts. The first bracket fixing portion 1101 may include a first bolt fastening hole 1101a for bolt fastening. The second bracket fixing portion 1102 includes a second bolt fastening hole 1102a for bolt fastening.

The second PCB 402 includes a first bolt fastening portion 901 aligned with the first bolt fastening hole 1101a, and a second bolt fastening portion 902 aligned with the second bolt fastening hole 1102a. The first bolt fastening portion 901 may include a bolt fastening hole corresponding to the first bolt fastening hole 1101a, and the second bolt fastening portion 902 may include a bolt fastening hole corresponding to the second bolt fastening hole 1102a. The first bracket fixing portion 1101, the second bracket fixing portion 1102, and the second PCB 402 may be coupled to the support structure 311 of the front case 310 by using bolt fastening. The first bolt fastening portion 901 and the second bolt fastening portion 902 may include female threads engageable with male threads of a bolt.

The first bracket 62 and the second bracket 63 may be electrically connected to the second PCB 402. For example, the first bracket 62 and the second bracket 63 may be electrically connected to a ground plane included in the second PCB 402 through the first bracket fixing portion 1101 and the second bracket fixing portion 1102. In the second PCB 402, the first bolt fastening portion 901 may be electrically connected to the ground plane, and the first bracket fixing portion 1101 may be electrically connected to the first bolt fastening portion 901 through a bolt. In the second PCB 402, the second bolt fastening portion 902 may be electrically connected to the ground plane, and the second bracket fixing portion 1102 may be electrically connected to the second bolt fastening portion 902 through a bolt.

The first bracket 62 and the second bracket 63 may be electrically connected to the shell 61, e.g., through welding. In some embodiments, the first bracket 62 and the second bracket 63 may be in physical contact with the shell 61 to conduct electricity with the shell 61. In some embodiments, a conductive bonding material may be positioned between the first bracket 62 and the shell 61, and/or between the second bracket 63 and the shell 61. The first bracket 62, the second bracket 63, and the shell 61 may be electrically connected to the ground plane included in the second PCB 402, and may serve as an electromagnetic shield structure (or ground structure) for the first connector 410. The electromagnetic shield structure may reduce an influence (e.g., electromagnetic interference) on the signal when the electronic device 100 exchanges a signal with an external electronic device through the first connector 410. The electromagnetic shield structure may reduce the effect of electromagnetic noise on the first connector 410. An electromagnetic field may be generated at the first connector 410 when the electronic device 100 exchanges a signal with an external electronic device through the first connector 410, and the electromagnetic shield structure may reduce the effect of the electromagnetic field on other elements around the first connector 410.

The first bracket fixing portion 1101 and the second bracket fixing portion 1102 may be electrically and mechanically connected to the second PCB 402 by using a conductive bonding material (e.g., solder). The second PCB 402 may include a first land (e.g., a copper foil pad) corresponding to the first bracket fixing portion 1101, and a second land corresponding to the second bracket fixing portion 1102. A conductive bonding material may be positioned between the first bracket fixing portion 1101 and the first land and between the second bracket fixing portion 1102 and the second land.

In some embodiments, the first connector 410 may further include one or more fixing portions extended from the first bracket 62 or the second bracket 63 and inserted into component mounting holes formed in the second PCB 402. The one or more fixing portions may be electrically and mechanically coupled to the second PCB 402 by using a conductive bonding material.

In some embodiments, the second PCB 402 may include a first component mounting hole corresponding to the first bracket fixing portion 1101, and a second component mounting hole corresponding to the second bracket fixing portion 1102. In this case, the first bracket fixing portion 1101 may be implemented to be insertable into the first component mounting hole, and the second bracket fixing portion 1102 may be implemented to be insertable into the second component mounting hole. A first end of the first bracket fixing portion 1101 inserted into the first component mounting hole may protrude with respect to the second surface 402b of the second PCB 402, and the first end may be electrically and mechanically connected to a land (e.g., a copper foil pad) formed around the first component mounting hole by using a conductive bonding material (e.g., solder). A second end of the second bracket fixing portion 1102 inserted into the second component mounting hole may protrude with respect to the second surface 402b of the second PCB 402, and the second end may be electrically and mechanically connected to a land formed around the second component mounting hole by using a conductive bonding material. The first bracket fixing portion 1101 and the second bracket fixing portion 1102 may be electrically and mechanically connected to the second PCB 402 in various other ways. In some embodiments, the first connector 410 may further include one or more fixing portions extended from the shell 61 and electrically and mechanically connected to the second PCB 402.

The terminal structure 64 (or tongue) may include a first support member 641, a second support member 642, and a plurality of conductive patterns 643. The first support member 641 may include a base 710 and a first plate 720. The base 710 may be located in the hollow 611 of the shell 61 closer to the second opening than the first opening of the shell 61. The base 710 and a portion of the hollow 611 corresponding to the base 710 may have a shape or structure that can be fitted to each other.

The first plate 720 may extend from the base 710 in the form of a cantilever. For example, one end of the first plate 720 may be fixed to the base 710, and the other end of the first plate 720 may be in an unsupported state (e.g., in a free state). The first plate 720 may be positioned to be spaced apart from the inner surface of the shell, and may protrude out of the first opening of the shell 61.

The base 710 or the first plate 720 may include a non-conductive material of various polymers such as glass-filled nylon. In a certain embodiment, the base 710 and the first plate 720 may be integrally formed and may include the same polymer. Alternatively, the base 710 and the first plate 720 may include different polymers. The plurality of conductive patterns 643 may be disposed on the first support member 641 and may be physically separated from each other. The plurality of conductive patterns 643 may include a plurality of terminals 730 (e.g., contacts or pins) positioned on the first plate 720 and exposed to the outside, and a plurality of leads extending from the plurality of terminals 730 to the base 710 (e.g., inside of the base 710). The plurality of terminals 730 may be in the form of a thin plate having a length extending in a first direction (e.g., negative y-axis direction) from the second opening of the shell 61 to the first opening, and may be arranged in a second direction (e.g., x-axis direction) orthogonal to the first direction.

Lengths of, widths of, or intervals between the plural terminals 730 may be formed in various ways. The plurality of leads may include a plurality of tails 640 exposed toward the first surface 402a of the second PCB 402. The plurality of tails 640 may be electrically and mechanically connected to a plurality of lands disposed on the second PCB 402 by using a conductive bonding material.

The first connector 410 may be a type-C socket connector (or a reversible socket connector) that allows a type-C header connector to be connected without distinction between top and bottom. The first plate 720 of the first support member 641 may include an upper surface 721 facing the first surface 200A of the electronic device 100 as illustrated in FIG. 1, and a lower surface 722 facing the second surface 200B of the electronic device 100 as illustrated in FIG. 2.

The plurality of terminals 730 may include first terminals disposed on the upper surface 721 and second terminals disposed on the lower surface. The first terminals may include a ground terminal, terminals supporting high-speed data transmission, terminals supporting power supply, a channel configuration (CC) terminal, a sideband use (SBU) terminal, or terminals supporting low-speed data transmission. The second terminals may include terminals for the same function as the first terminals, and may be arranged opposite to the first terminals. The first connector 100 may support, for example, USB 2.x, 3.x or higher communication protocols.

The first support member 641 of the terminal structure 64 may include a second plate 740 (e.g., a mid-plate) positioned at least partially inside the first plate 720 between the upper surface 721 and the lower surface 722 of the first plate 720. The second plate 740 may be extended inside the base 710. The second plate 740 may have a greater strength than that of the first plate 720, and may contribute to the durability (or mechanical strength) of the first support member 641. The second plate 740 may include a conductive material and may be electrically connected to the second PCB 402. For example, the tail of at least one lead extended from the second plate 740 (e.g., some of the tails 740 in FIG. 7 or 8) may be electrically and mechanically connected to a land disposed on the second PCB 402 by using a conductive bonding material (e.g., solder). The conductive second plate 740 may be electrically connected to the ground plane included in the second PCB 402 to thereby serve as an electromagnetic shield structure. The conductive second plate 740 may reduce an influence (e.g., electromagnetic interference (EMI)) on the signal when the electronic device 100 exchanges a signal with an external electronic device through the first connector 410. The conductive second plate 740 may reduce the electromagnetic effect of electromagnetic noise on the first connector 410. The conductive second plate 740 may reduce electromagnetic influence between the first terminals disposed on the upper surface 721 of the first plate 720 and the second terminals disposed on the lower surface of the first plate 720. The conductive second plate 740 may reduce electromagnetic influence of the first connector 410 on other elements in the vicinity.

The second support member 642 of the terminal structure 64 may be coupled to the first support member 641, or may be integrally formed with the first support member 641 to include the same material as the first support member 641. The first support member 641 and the second support member 642 may be integrally implemented, e.g., through injection molding. The first support member 641 and the second support member 642 may be implemented in a form coupled with the plurality of conductive patterns 643 and/or the conductive second plate 740 by using insert molding. The second support member 642 may be coupled to the first bracket 62 and/or the second bracket 630, and may support the first support member 641 so that the first support member 641 may be stably positioned in the hollow 611 of the shell 61. The plurality of tails 640 may be supported by the second support member 642 to be exposed toward the first surface 402a of the second PCB 402.

The stopper 65 may serve to determine the position of the terminal structure 64 with respect to the shell 61 when the shell 61 and the terminal structure 64 are coupled. In some embodiments, the shell 610 and the stopper 65 may also be integrally implemented.

The cover member 66 may be coupled to the first bracket 62 and/or the second bracket 63 on the opposite side of the first opening of the shell 61 to cover one side of the first connector 410. In some embodiments, the cover member 66 may be made of a variety of seal members.

The seal member 67 may be disposed on the shell outer surface 612 of the shell 61. The seal member 67 may be in the form of a ring and include a flexible material such as rubber or an elastic material. The seal member 67 may include an O-ring. The shell 61 may include a support portion (or a wall) 615 protruding from the shell outer surface 612, and the support portion 615 may be in the form of a ring extended along the shell outer surface 612. The first bracket 62 and the second bracket 63 may be positioned to cover one side region of the shell outer surface 612 with respect to the support portion 615, and the seal member 67 may be positioned on the other side region 616 of the shell outer surface 612 with respect to the support portion 615.

When the first connector 410 is positioned in correspondence to the first connector hole 431 as illustrated in FIG. 4, the seal member 67 may be compressed by a designated portion (or a designated area) of the hole structure forming the first connector hole 431 of the front case 310. The seal member 67 may be supported by the support portion 615 and a support region 616 so as to be in elastic contact with the designated portion of the hole structure included in the front case 310 forming the first connector hole 431. Accordingly, the seal member 67 may be in close contact with the hole structure forming the first connector hole 431, without an air gap. Because of the seal member 67 in compressed state between the hole structure forming the first connector 431 and the shell 61, it is possible to secure the sealing performance (e.g., waterproof performance) that prevents foreign substances such as water or dust from entering the inside of the electronic device 100 between the first connector 410 and the hole structure. In some embodiments, the seal member 67 may be implemented in an integral form with the shell 61 by using insert molding. In some embodiments, the seal member 67 and the shell 61 may be coupled in a structure such as a dovetail joint. In some embodiments, various polymeric adhesive materials may be positioned between the seal member 67 and the shell 61.

The second bracket 63 may include a protrusion 500 protruding with respect to the second surface 402b of the second PCB 402. A portion of the second cover part 631 included in the second bracket 63 may be positioned at the notch 403 of the second PCB 402, and the protrusion 500 may be bent and extended from the second cover part 631. The second cover part 631 of the second bracket 63 may not protrude with respect to the second surface 402b of the second PCB 402 through the notch 403. When an assembly device such as a jig moves the second board assembly 322 to a designated position of the front case 310 as illustrated in FIG. 4, the protrusion 500 may be a portion pressurized by the assembly device due to the movement of the assembly device. The protrusion 500 may be a portion of the second board assembly 322 through which the assembly device can apply a force to the second board assembly 322 while reducing damage to the second board assembly 322. The protrusion 500 may contribute to an operation of assembling the second board assembly 322 and the front case 310 by using an assembly device such as a jig in one embodiment.

The first connector 410 may be a surface mount type connector, and may be disposed on the first surface 402a of the second PCB 402. In this case, the protrusion 500 may protrude with respect to the second surface 402b of the second PCB 402 through the opening formed in the second PCB 402.

Figure 12:
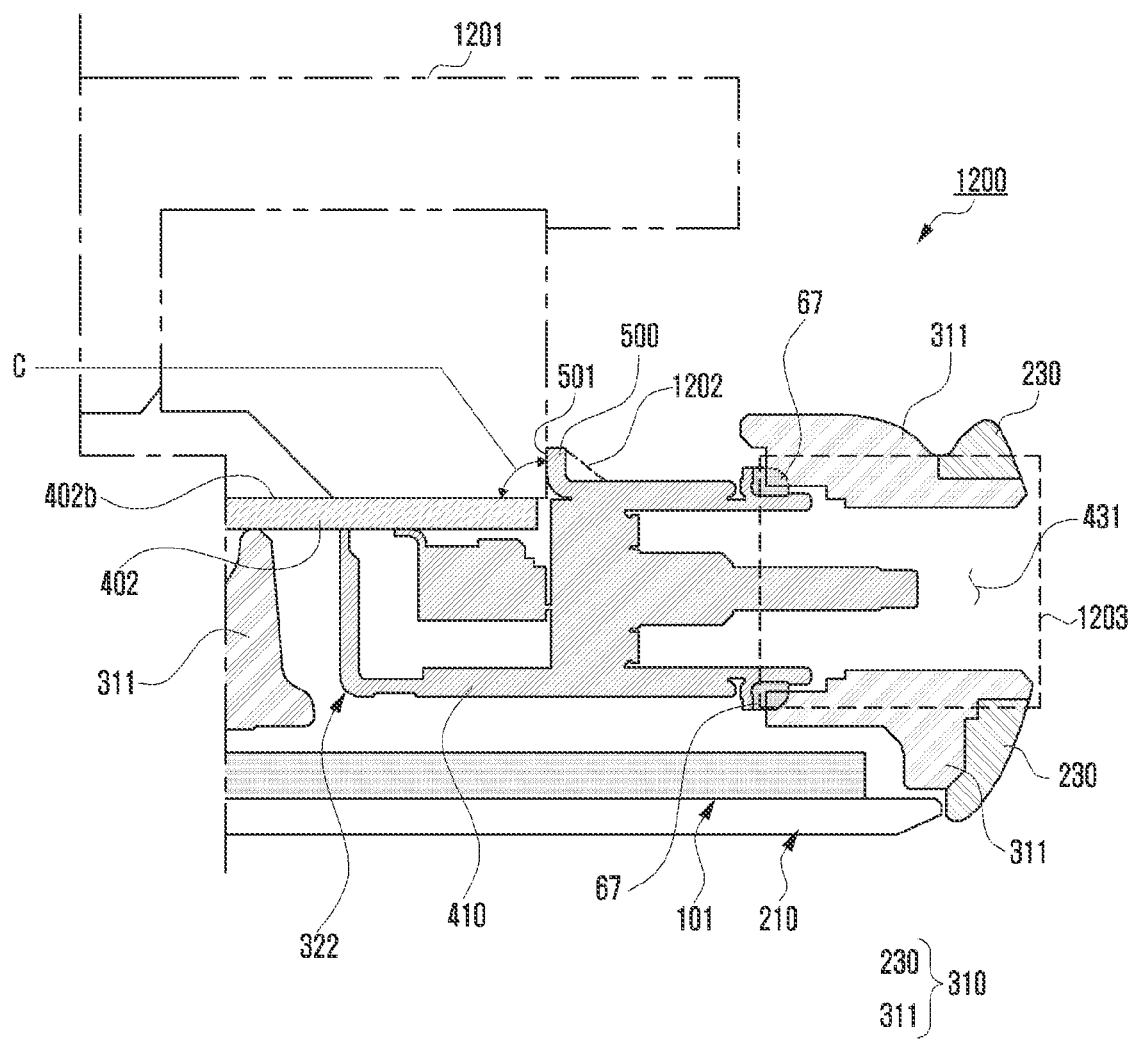
FIGS. 12 and 13 illustrate cross-sectional views of assembly operations of the electronic device of FIG. 1, according to an embodiment.
Figure 13:
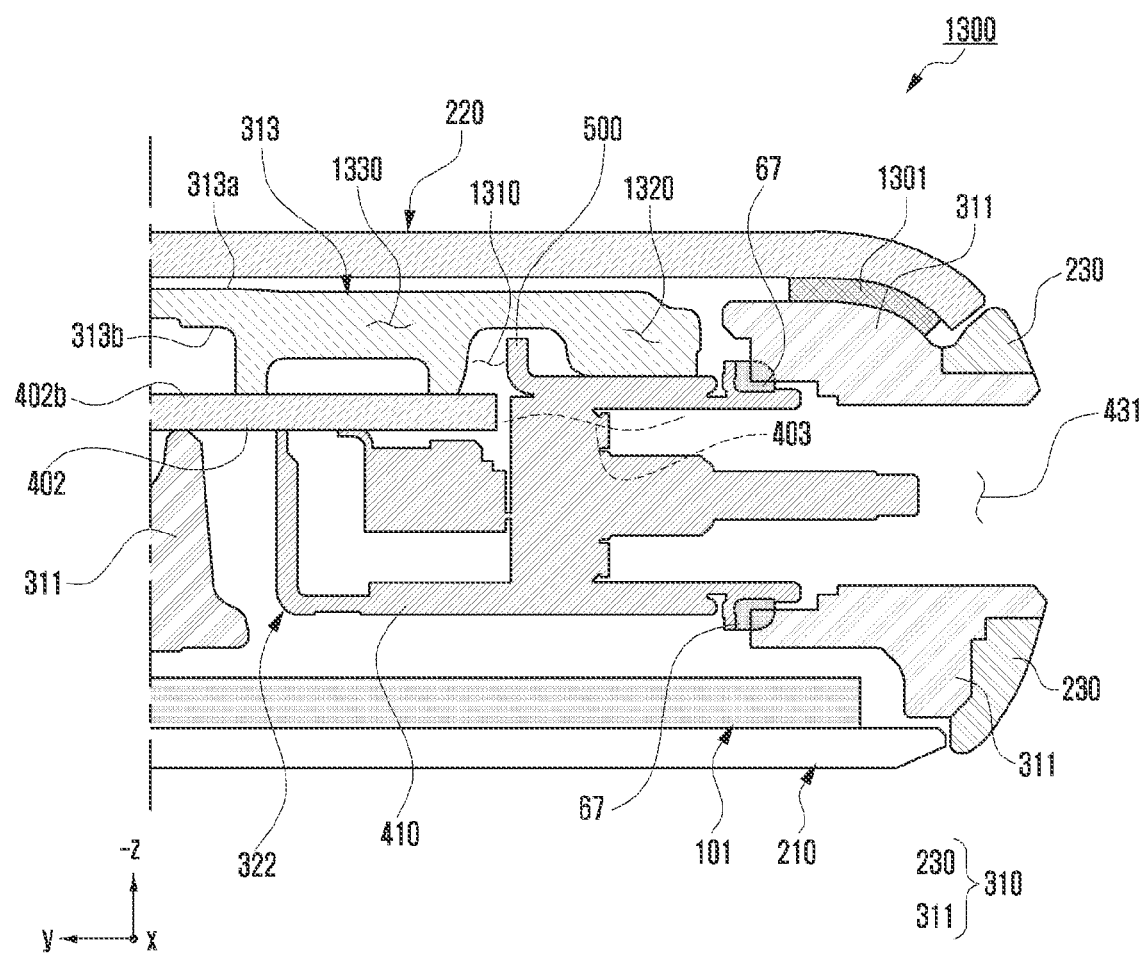

FIGS. 12 and 13 illustrate cross-sectional views of assembly operations of the electronic device 100 of FIG. 1, according to an embodiment.

More specifically, FIG. 12 illustrates a cross-sectional structure 1200 with respect to line A-A' in FIG. 5. The cross-sectional structure 1200 includes a first housing part 210, a front case 310, a second board assembly 322, and/or a display 101. The front case 310 may include a support structure 311 and a bezel structure 230.

At a first assembly operation, the second board assembly 322 may be moved to a designated position of the front case 310 by using an assembly device 1201 (e.g., a jig). The second PCB 402 may be positioned in the front case 310 in substantially parallel with the first surface 200A (e.g., see FIG. 1) of the electronic device 100.

The first assembly operation may include an operation of coupling the second board assembly 322 with the support structure 311 by using a fastening element such as a bolt. At the first assembly operation, the assembly device 1201 may apply a force to the protrusion 500 of the first connector 410 disposed on the second PCB 402 to move the second board assembly 322. The protrusion 500 is a portion protruding with respect to the second surface 402b of the second PCB 402, and may be bent and extended from the second cover part 631 (see FIG. 7) of the second bracket 63 in one embodiment. Due to first assembly operation using the assembly device 1201, the first connector 410 may be aligned in correspondence to the first connector hole 431 of the fourth bezel part 234. When the second board assembly 322 is disposed at the designated position of the front case 310, the seal member 67 positioned at the first connector 410 may be in elastic contact with a designated portion (or designated region) of the hole structure 1203 forming the first connector hole 431 in the front case 310, so that it is possible to secure the sealing performance (e.g., waterproof performance) that prevents foreign substances such as water or dust from entering the inside of the electronic device 100 between the first connector 410 and the hole structure 1203.

The protrusion 500 may include a pressurized surface 501 that is in contact with the assembly device 1201 and directly receives a force from the assembly device 1201. At least a portion of the pressurized surface 501 may include a flat surface. The angle C between the pressurized surface 501 of the protrusion 500 and the second surface 402b of the second PCB 402 may be about 90 degrees, may be an acute angle, or may be an obtuse angle.

In some embodiments, the pressurized surface 501 of the protrusion 500 is not limited to a flat surface and may include a curved surface. The pressurized surface 501 may be formed in other various types of surfaces. The pressurized surface 501 may be formed in a surface shape corresponding to the pressing portion of the assembly device 1201 or in a shape capable of securing a contact area with the pressing portion of the assembly device 1201. In some embodiments, the pressurized surface 501 may be formed in a shape capable of reducing a frictional force with the pressing portion of the assembly device 1201.

The material or shape of the protrusion 500 may be designed in consideration of various characteristics such as tensile strength, flexural strength, shear strength, compressive strength, or fatigue strength under the condition that the assembly device 1201 pressurizes the protrusion 500. As a result, damage or deformation of the protrusion 500 may be prevented when the assembly device 1201 presses the protrusion 500, thereby reducing assembly defects.

In some embodiments, the first connector 410 may further include at least one support portion (e.g., a rib), as shown by a dash-double dotted line (e.g., a phantom line) indicated by reference numeral 1202, for supporting the protrusion 500 on the opposite side of the pressurized surface 501. When the assembly device 1201 presses the protrusion 500, the at least one support portion 1202 may reduce stress generated in the protrusion 500. The protrusion 500 may be implemented by including at least one support portion 1202, or the at least one support portion 1202 may be separately provided and disposed on the first connector 410 in some cases. In some embodiments, the protrusion 500 may be extended in a cross-sectional shape that narrows in a direction from the first housing part 210 to the second housing part 220 (e.g., a negative z-axis direction), thereby reducing stress generated at the protrusion 500 when pressurized by the assembling device 1201.

In some embodiments, the protrusion 500 may be formed in plurality without being limited to the illustrated example. In this case, the shape (e.g., thickness, height, or width) of plural protrusions or spacing therebetween may be varied.

In some embodiments, the protrusion 500 may be separately provided and coupled to the first connector 410. For example, the protrusion 500 may be coupled to the first connector 410 by using a fastening element such as a bolt.

Referring to the cross-sectional structure 1300 of FIG. 13, at a second assembly operation, the rear case 313 may be positioned to cover the second board assembly 322. The second assembly operation may include an operation of coupling the rear case 313 with the second board assembly 322 and/or the support structure 311 by using a fastening element such as a bolt.

At a third assembly operation, the second housing part 220 may be coupled to the front case 310. For example, an adhesive material 1301 of various polymers may be positioned between the second housing part 220 and the front case 310. When viewed from above the second housing part 220 (e.g., viewed in positive z-axis direction), the rear case 313 may cover a portion of the first connector 410, but the structure in which the first connector 410 is disposed on the second PCB 402 by using the notch 403 may contribute to slimming of the electronic device 100. When viewed from above the second housing part 220, the rear case 313 may be positioned to cover a portion of the first connector 410, which may contribute to the durability or rigidity of the electronic device 100 compared with otherwise cases.

The rear case 313 may include, for example, a third surface 313a facing the second housing part 220, and a fourth surface 313b positioned on the opposite side of the third surface 313a. The rear case 313 may include a recess 1310 formed on the fourth surface 313b in correspondence to the protrusion 500 of the first connector 410. The protrusion 500 of the first connector 410 may be inserted into the recess 1310 of the rear case 313. The structure in which the protrusion 500 of the first connector 410 protruding with respect to the second surface 401b of the second PCB 402 is inserted into the recess 1310 of the rear case 313 may contribute to slimming and space efficiency of the electronic device 100.

The rear case 313 may include a first support part 1320 and a second support part 1330 extended from the first support part 1320. The first support part 1320 of the rear case 313 may support a portion of the first connector 410 exposed through the notch 403 of the second PCB 402. For example, at least a region included in the first support part 1320 among the fourth surface 313b may be in direct contact with the surface exposed through the notch 403 among the second cover part 631 (see FIG. 9) of the second bracket 63. The first support part 1320 may contribute to stable positioning of the first connector 410 between the second PCB 402 and the first connector hole 431. The first support part 1320 may reduce stress generated in a coupling structure between the second PCB 402 and the first connector 410 in response to an external load or external shock applied to the first connector 410 and may contribute to the durability or rigidity of the coupling structure. The first support part 1320 may contribute to preventing the coupling structure between the second PCB 402 and the first connector 410 from being deformed or damaged due to an external load or external impact applied to the first connector 410, for example, when an external connector is connected to or disconnected from the first connector 410. The structure in which the first support part 1320 supports the first connector 410 may contribute to allowing the seal member 67 of the first connector 410 to maintain stable contact with a designated portion (or, designated region) of the first connector hole 431 in response to an external load or external shock applied to the first connector 410.

A buffer member capable of mitigating an external load or external shock may be positioned between the first support part 1320 and the first connector 410. The buffer member may be located at the first support part 1320 or the first connector 410. The second PCB 402 may be positioned between the support structure 311 of the front case 310 and the second support part 1330 of the rear case 313. For example, at least a portion of the fourth surface 313b included in the second support part 1330 may be in direct contact with the second surface 402b of the second PCB 402. The second support part 1330 of the rear case 313 may be coupled to the second PCB 402 and the support structure 311 of the front case 310. The second support part 1330, the first bracket fixing portion 1101 and the second bracket fixing portion 1102 of FIG. 8 included in the first connector 410, and the first bolt fastening portion 901 and the second bolt fastening portion 902 of FIG. 9 included in the second PCB 402 may be coupled to the support structure 311 of the front case 310 by using bolts. The second PCB 402 may be supported by the second support part 1330 of the rear case 313, so that it can be stably positioned on the support structure 311 of the front case 310. The first support part 1320 of the rear case 313 may be supported by the second support part 1330 coupled to the second PCB 402 and the support structure 311 of the front case 310 in order to stably support the first connector 410.

To help understand some effects (or advantages) of the protrusion 500 that is bent and extended from the portion of the second bracket 63 that does not protrude with respect to the second surface 402b of the second PCB 402, a description will be given of problems that may arise in a comparative example in which the second bracket 63 is implemented without the protrusion 500 and is positioned to protrude with respect to the second surface 402b of the second PCB 402 in correspondence to an assembly device such as a jig. It should be understood that this comparative example is construed only as an example for helping the understanding of the disclosure and is not applied as prior art to the disclosure. Since the comparative example requires a larger space (or area) than the recess 1310 of the rear case 313 corresponding to the protrusion 500 of the disclosure, the comparative example may have a problem in that it is difficult to secure enough supporting force compared to that of the first support part 1320 supporting the first connector 410 in proximity to the recess 1310 according to the disclosure. In the comparative example, the thickness of the rear case may be increased to secure the supporting force, but this may have a problem of making it difficult to slim the electronic device. The protrusion 500 according to the disclosure may not cause the above problems related to the comparative example. The protrusion 500 according to the disclosure allows utilization of an assembly device such as a jig when placing the second board assembly 322 including the first connector 410 and the second PCB 402 at a designated position inside the electronic device 100, which may contribute to efficient assembly and mass production, while reducing manufacturing cost.

In some embodiments, the first support part 1320 of the rear case 313 may be omitted according to the form in which the first connector 410 is arranged on the second PCB 402, or the coupling structure between the first connector 410 and the second PCB 402.

According to an embodiment of the disclosure, an electronic device (e.g., the electronic device 100 in FIG. 1) may include a PCB (e.g., the second PCB 402 in FIG. 10 or 11) that includes a first surface (e.g., the first surface 402a in FIG. 11) and a second surface (e.g., the second surface 402b in FIG. 10) facing in a direction opposite to the first surface. The electronic device may include an interface terminal (e.g., the first connector 410 in FIG. 10 or 11) positioned at least partially on the first surface of the PCB. The interface terminal may include a shell (e.g., the shell 61 in FIG. 6) that includes a hollow extending from a first opening on one side to a second opening on the other side. The interface terminal may include a terminal structure (e.g., the terminal structure 64 in FIG. 6) that includes a non-conductive plate (e.g., the first plate 720 in FIG. 6) positioned in the hollow and a plurality of terminals (e.g., the plural terminals 730 in FIG. 6) positioned on the non-conductive plate. The interface terminal may include a first bracket (e.g., the first bracket 62 in FIG. 6) that at least partially covers one surface (e.g., the first region 613 in FIG. 6) of the shell. The interface terminal may include a second bracket (e.g., the second bracket 63 in FIG. 6) that at least partially covers the other surface (e.g., the second region 614 in FIG. 6) of the shell. The second bracket may include a protrusion (e.g., the protrusion 500 in FIG. 9) protruding with respect to the second surface.

According to an embodiment of the disclosure, the protrusion (e.g., the protrusion 500 in FIG. 9) may be bent and extended from the portion that does not protrude with respect to the second surface (e.g., the second surface 402b in FIG. 9) among the second bracket (e.g., the second bracket 63 in FIG. 9).

According to an embodiment of the disclosure, the PCB (e.g., the second PCB 402 in FIG. 9) may include a notch (e.g., the notch 403 in FIG. 9). The protrusion may protrude with respect to the second surface (e.g., the second surface 402b in FIG. 9) through the notch.

According to an embodiment of the disclosure, the electronic device may further include a support member (e.g., the rear case 313 in FIG. 13). The support member may include a first support part (e.g., the first support part 1320 in FIG. 13) for supporting one surface of the second bracket (e.g., the second bracket 63 in FIG. 9) exposed through the notch (e.g., the notch 403 in FIG. 13) in a direction where the second surface (e.g., the second surface 420b in FIG. 9) faces, and a second support part (e.g., the second support part 1330 in FIG. 13) extended from the first support part to support the second surface.

According to an embodiment of the disclosure, the support member (e.g., the rear case 313 in FIG. 13) may further include a recess (e.g., the recess 1310 in FIG. 13) into which the protrusion (e.g., the protrusion 500 in FIG. 13) is inserted.

According to an embodiment of the disclosure, the shell (e.g., the shell 61 in FIG. 6) may be formed without a seam.

According to an embodiment of the disclosure, the shell (e.g., the shell 61 in FIG. 6) may be manufactured using deep drawing.

According to an embodiment, of the disclosure, in an operation of disposing the PCB (e.g., the second PCB 402 in FIG. 12) on which the interface terminal (e.g., the first connector 410 in FIG. 12) is located at a designated position inside the electronic device by using a jig (e.g., the assembly device 1201 in FIG. 12), the protrusion (e.g., the protrusion 500 in FIG. 12) may receive a force from the jig.

According to an embodiment, of the disclosure, the interface terminal (e.g., the first connector 410 in FIG. 11) may include a USB connector.

According to an embodiment of the disclosure, the interface terminal (e.g., the first connector 410 in FIG. 11) may include a type-C connector.

According to an embodiment of the disclosure, the electronic device may further include another interface terminal (e.g., the second connector 420 in FIG. 11) positioned on the first surface (e.g., the first surface 402a in FIG. 11).

According to an embodiment of the disclosure, the other interface terminal (e.g., the second connector in FIG. 11) may include a memory card connector.

According to an embodiment of the disclosure, the other interface terminal (e.g., the second connector 420 in FIG. 11) may include a connector related to a SIM card.

According to an embodiment of the disclosure, the first bracket (e.g., the first bracket 62 in FIG. 6) and the second bracket (e.g., the second bracket 63 in FIG. 6) may be coupled to the shell (e.g., the shell 61 in FIG. 6) by using welding.

According to an embodiment of the disclosure, the first bracket (e.g., the first bracket 62 in FIG. 6) and the second bracket (e.g., the second bracket 63 in FIG. 6) may include a metal material different from that of the shell (e.g., the shell 61 in FIG. 6).

According to an embodiment of the disclosure, the first bracket (e.g., the first bracket 62 in FIG. 6) and the second bracket (e.g., the second bracket 63 in FIG. 6) may include a metal material the same as that of the shell (e.g., the shell 61 in FIG. 6).

According to an embodiment of the disclosure, the protrusion (e.g., the protrusion 500 in FIG. 12) may make an angle of 90 degrees with the second surface (e.g., the second surface 402b in FIG. 12).

According to an embodiment of the disclosure, the protrusion (e.g., the protrusion 500 in FIG. 12) may make an acute angle with the second surface (e.g., the second surface 402b in FIG. 12).

According to an embodiment of the disclosure, the electronic device may further include a housing (e.g., the housing 200 in FIG. 1) forming an outer surface of the electronic device. The interface terminal (e.g., the first connector 410 in FIG. 4) may further include a seal member (e.g., the seal member 67 in FIG. 6) positioned at the shell (e.g., the shell 61 in FIG. 6) in correspondence to a hole (e.g., the first connector hole 431 in FIG. 4) formed in the housing.

According to an embodiment of the disclosure, an electronic device may include a housing (e.g., the housing 200 in FIG. 1 or 2) that forms a front surface (e.g., the first surface 200A in FIG. 1) of the electronic device, a rear surface (e.g., the rear surface 200B in FIG. 2) of the electronic device, and a side surface (e.g., the side surface 200C in FIG. 1 or 2) of the electronic device that at least partially surrounds the space between the front surface and the rear surface. The PCB (e.g., the second PCB 402 in FIG. 4) may be positioned in parallel to the front surface or the rear surface inside the housing.

The above-described embodiments of the disclosure and drawings are provided as specific examples to easily explain the technical content of the disclosure and to help the understanding thereof, without limiting the disclosure to the scope of these embodiments. Therefore, not only the embodiments described above, but also changes or modifications thereof should be construed as being included in the scope of various embodiments of the disclosure.

According to an embodiment, an electronic device including an interface terminal is provided, which allows for the utilization of an assembly device, such as a jig, when placing a PCB on which the interface terminal (e.g., a connector) is disposed in the electronic device, thereby securing efficient assembly and mass production.

While the disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device, comprising:
a printed circuit board (PCB) including a first surface and a second surface facing in a direction opposite to the first surface; and
an interface terminal positioned at least partially on the first surface of the PCB,
wherein the interface terminal includes:
a shell including a hollow portion extending from a first opening on a first side of the shell to a second opening on a second side of the shell;
a terminal structure including a non-conductive plate positioned in the hollow portion and a plurality of terminals positioned on the non-conductive plate;
a first bracket at least partially covering a surface of the shell; and
a second bracket at least partially covering another surface of the shell,
wherein the first bracket and the second bracket formed to cover the shell outer surface from both sides, respectively,
wherein the second bracket includes a protrusion protruding with respect to the second surface of the PCB, and
wherein the protrusion is bent and extends at a portion that does not protrude with respect to the second surface of the PCB.

2. The electronic device of claim 1, wherein the PCB further includes a notch, and wherein the protrusion protrudes through the notch.

3. The electronic device of claim 2, further comprising a support member including a first support part supporting a first surface of the second bracket exposed through the notch in a direction in which the second surface faces, and a second support part extended from the first support part and supporting the second surface.

4. The electronic device of claim 3, wherein the support member further includes a recess into which the protrusion is inserted.

5. The electronic device of claim 1, wherein the shell is formed without a seam.

6. The electronic device of claim 5, wherein the shell is manufactured using deep drawing.

7. The electronic device of claim 1, wherein in an operation of placing the PCB at a designated position inside the electronic device by using a jig, the protrusion receives a force from the jig.

8. The electronic device of claim 1, wherein the interface terminal further includes a universal serial bus (USB) connector.

9. The electronic device of claim 8, wherein the interface terminal further includes a type-C connector.

10. The electronic device of claim 1, further comprising a second interface terminal positioned on the first surface of the PCB.

11. The electronic device of claim 10, wherein the second interface terminal includes a memory card connector.

12. The electronic device of claim 10, wherein the second interface terminal includes a connector related to a subscriber identification module (SIM) card.

13. The electronic device of claim 1, wherein the first bracket and the second bracket are coupled to the shell through welding.

14. The electronic device of claim 1, wherein the first bracket or the second bracket includes a metal material different from that of the shell.

15. The electronic device of claim 1, wherein the first bracket or the second bracket includes a metal material identical to that of the shell.

16. The electronic device of claim 1, wherein the protrusion forms a 90 degree angle with the second surface of the PCB.

17. The electronic device of claim 1, wherein the protrusion forms an acute angle with the second surface of the PCB.

18. The electronic device of claim 1, further comprising a housing that forms an outer surface of the electronic device,
wherein the interface terminal further includes a seal member positioned at the shell in correspondence to a hole formed in the housing.

19. The electronic device of claim 1, further comprising a housing that forms a front surface of the electronic device, a rear surface of the electronic device, and a side surface of the electronic device at least partially surrounding a space between the front surface and the rear surface,
wherein the PCB is positioned in parallel to the front surface or the rear surface inside the housing.

* * * * *